(12) United States Patent
Cheng et al.

(10) Patent No.: US 12,051,732 B2
(45) Date of Patent: Jul. 30, 2024

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Kuan-Hao Cheng, Hsinchu (TW); Wei-Yang Lee, Taipei (TW); Tzu-Hua Chiu, Hsinchu (TW); Wei-Han Fan, Hsin-Chu (TW); Po-Yu Lin, New Taipei (TW); Chia-Pin Lin, Xinpu Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 413 days.

(21) Appl. No.: 17/400,446

(22) Filed: Aug. 12, 2021

(65) Prior Publication Data

US 2023/0052084 A1    Feb. 16, 2023

(51) Int. Cl.

| | |
|---|---|
| *H01L 29/423* | (2006.01) |
| *H01L 29/06* | (2006.01) |
| *H01L 29/66* | (2006.01) |
| *H01L 29/786* | (2006.01) |

(52) U.S. Cl.
CPC .... *H01L 29/42392* (2013.01); *H01L 29/0673* (2013.01); *H01L 29/66545* (2013.01); *H01L 29/66636* (2013.01); *H01L 29/66787* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0220015 A1* | 7/2020 | Jang | H01L 29/66795 |
| 2021/0273099 A1* | 9/2021 | More | H01L 21/02521 |

* cited by examiner

*Primary Examiner* — Robert G Bachner
*Assistant Examiner* — Molly K Reida
(74) *Attorney, Agent, or Firm* — Birch, Stewart, Kolasch & Birch, LLP

(57) ABSTRACT

A semiconductor structure is provided. The semiconductor structure includes a first nanostructure stacked over and spaced apart from a second nanostructure, a gate stack wrapping around the first nanostructure and the second nanostructure, a source/drain feature adjoining the first nanostructure and the second nanostructure, and a first inner spacer layer interposing the gate stack and the source/drain feature and interposing the first nanostructure and the second nanostructure. A dopant in the source/drain feature has a first concentration at an interface between the first inner spacer layer and the source/drain feature and a second concentration at a first distance away from the interface. The first concentration is higher than the second concentration.

20 Claims, 16 Drawing Sheets

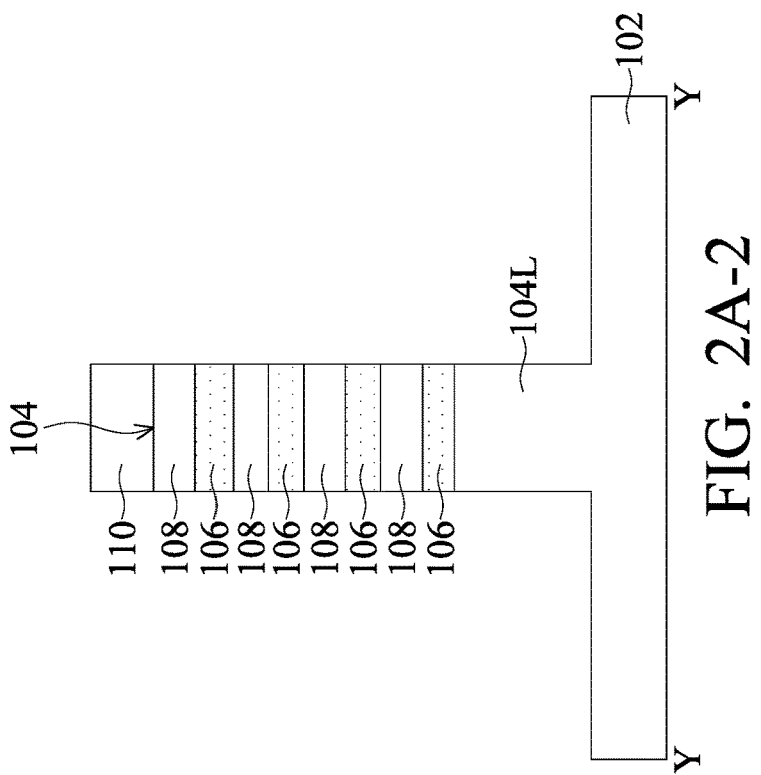
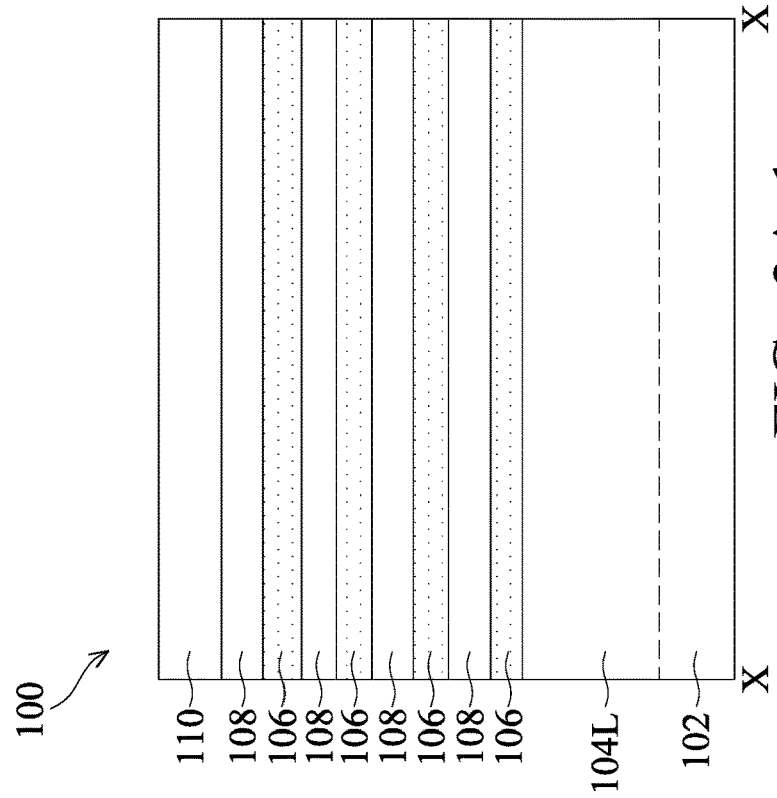

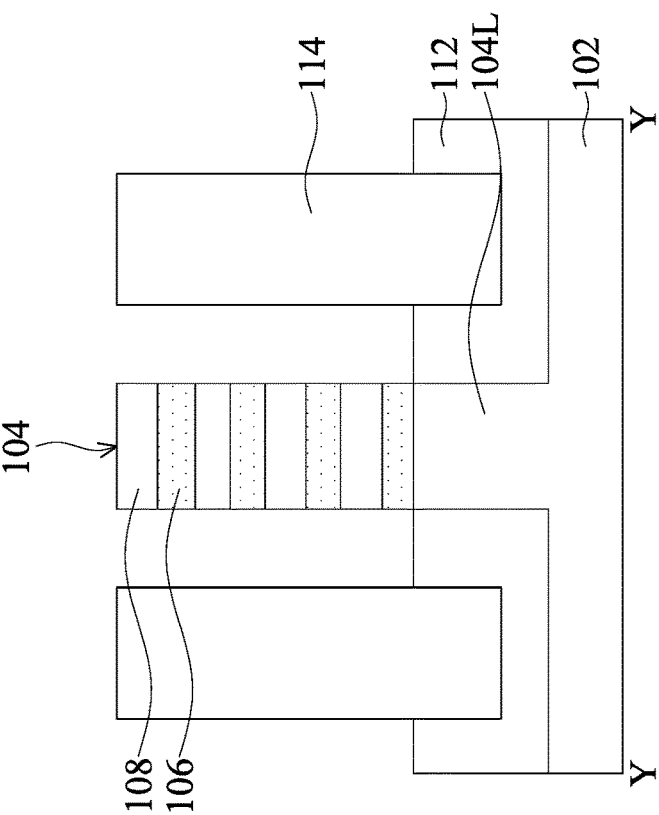
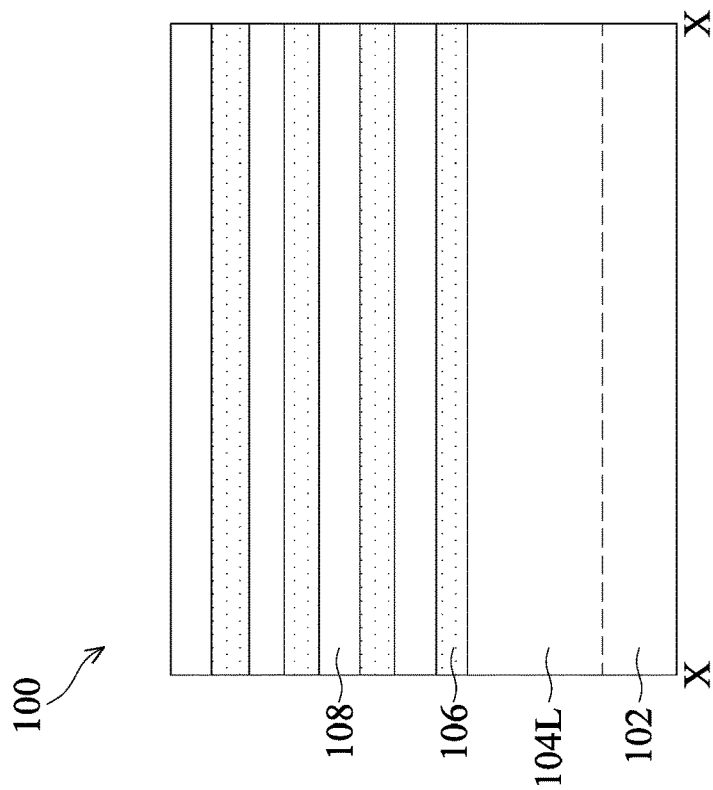
FIG. 2B-2
FIG. 2B-1

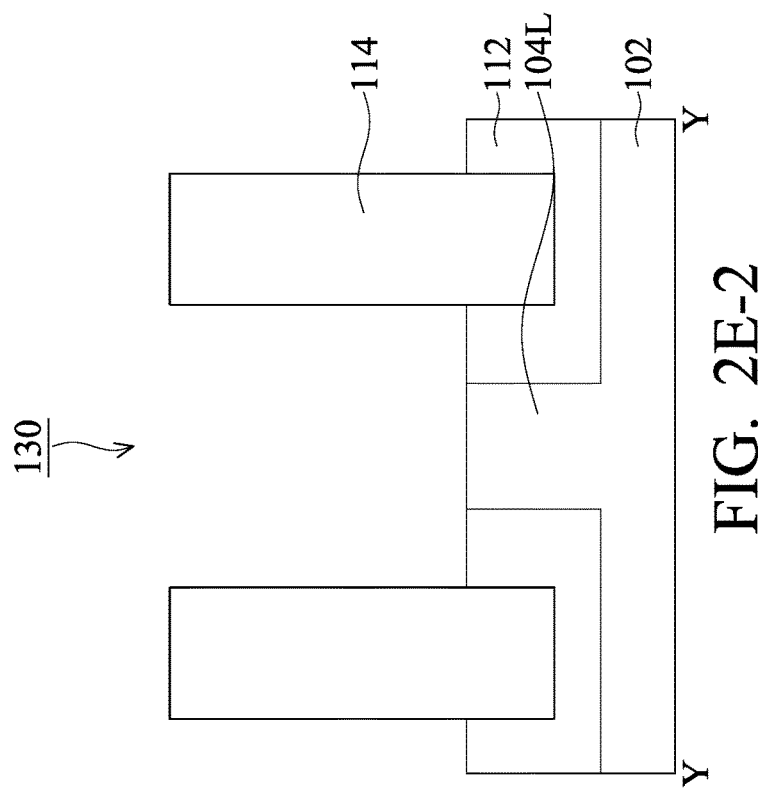
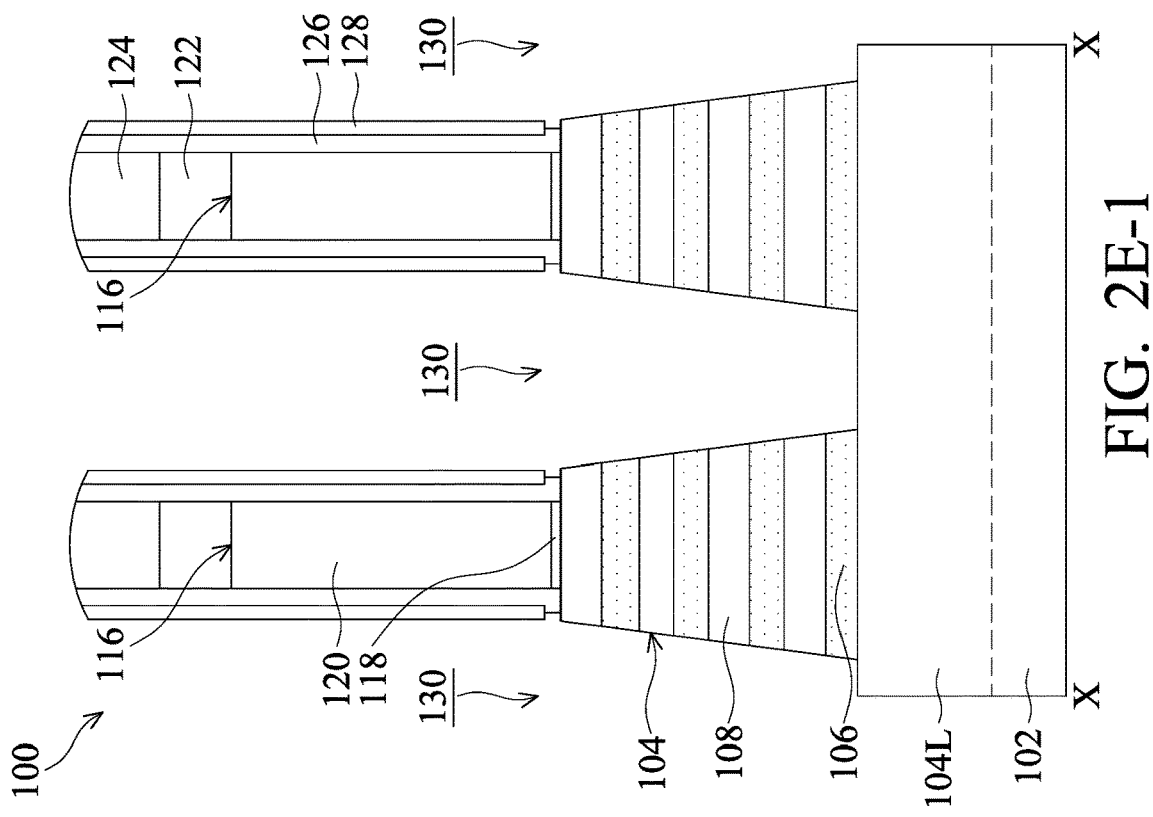
FIG. 2E-2
FIG. 2E-1

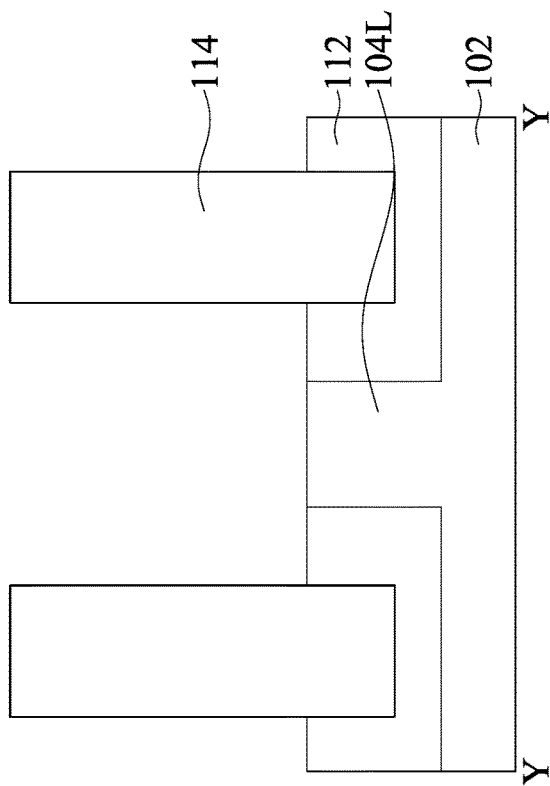
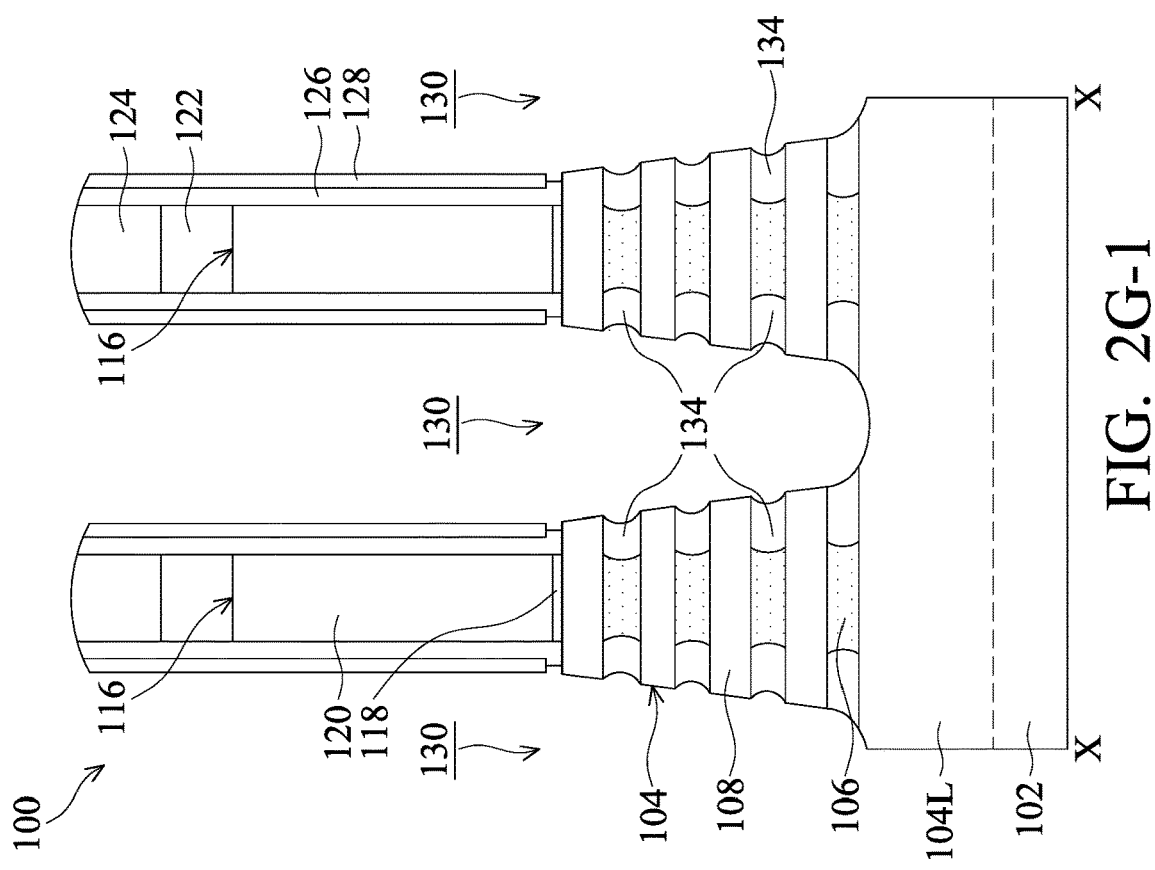
FIG. 2G-2
FIG. 2G-1

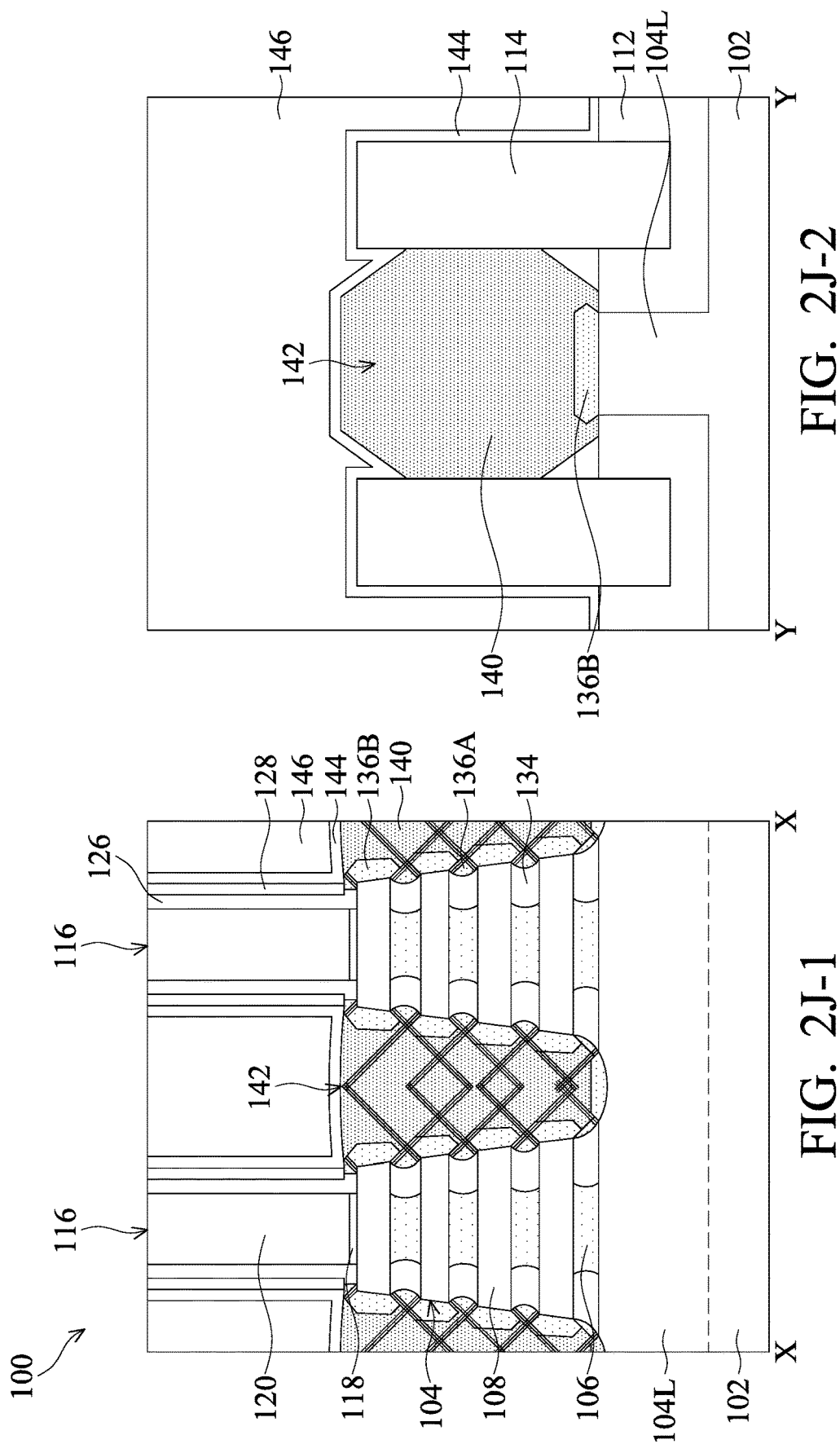

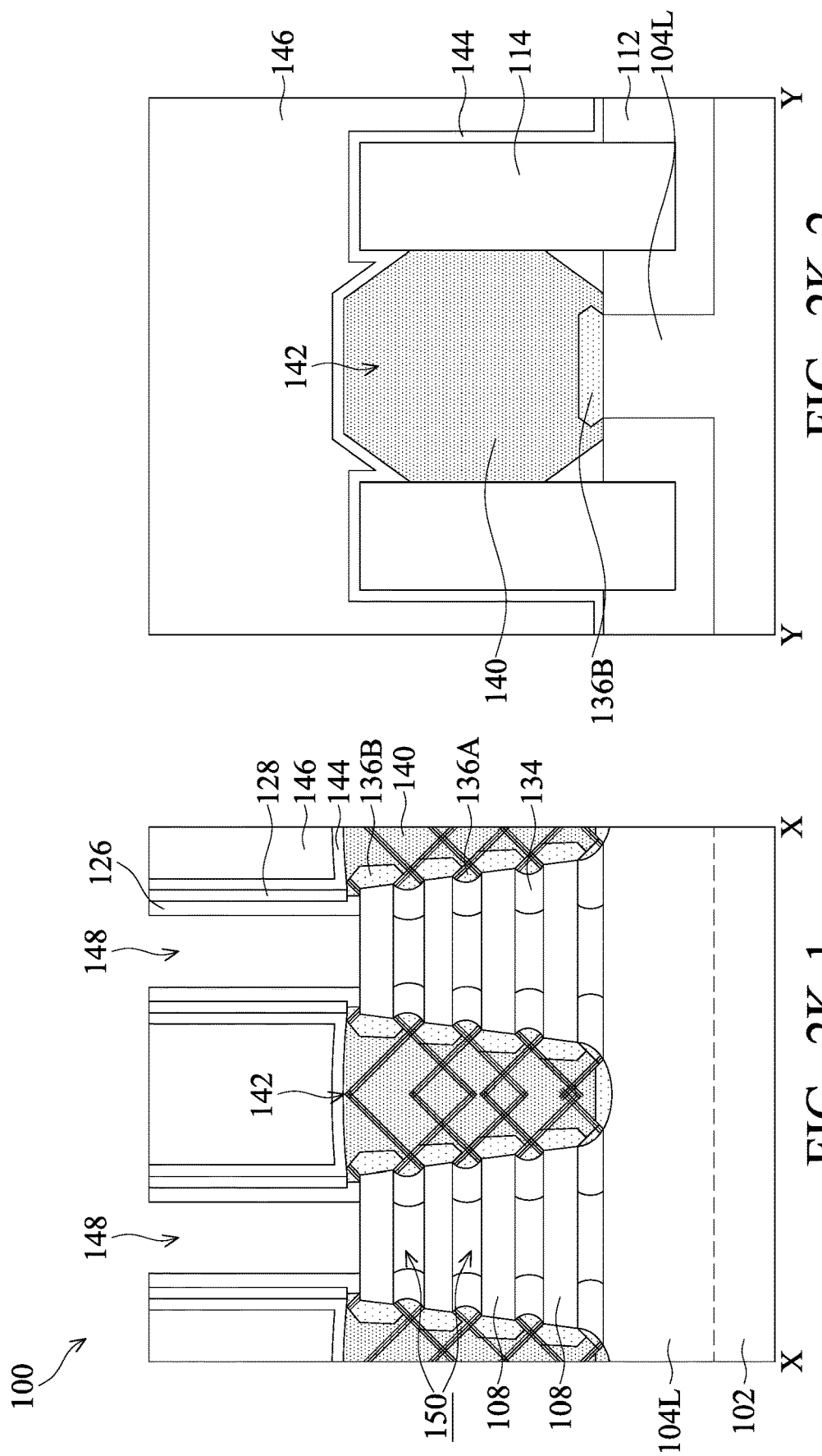

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 through 2L-2 are cross-sectional views illustrating the formation of a semiconductor structure at various intermediate stages, in accordance with some embodiments of the disclosure.

DETAILED DESCRIPTION

Figure 1:
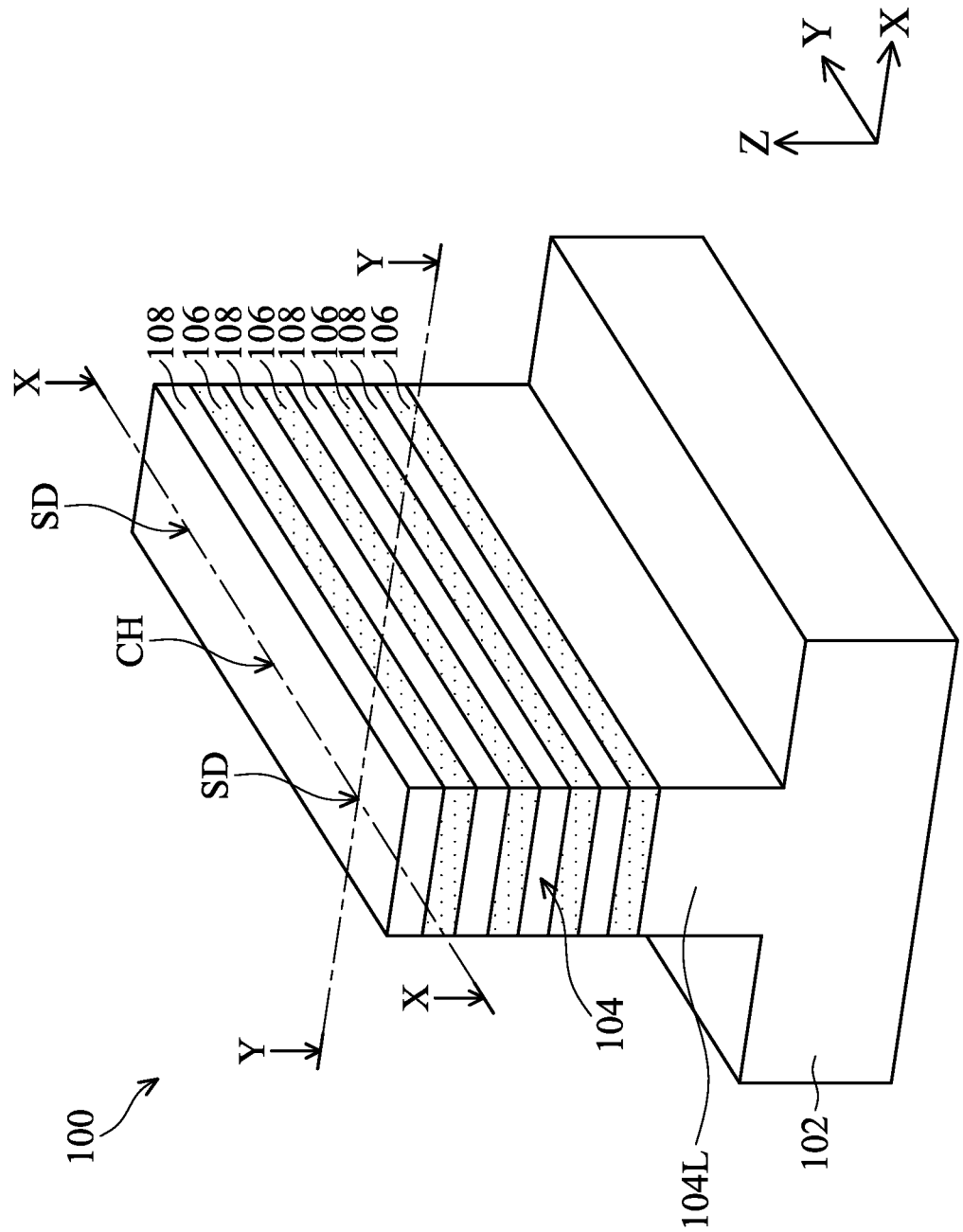
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure and a method for forming the same are provided. The aspect of the present disclosure is directed to forming a semiconductor structure having a reduced junction overlap. Embodiments of the semiconductor structure include a source/drain feature having dislocations therein, and the dislocations start from the sidewalls of the inner spacer and propagate into the bulk layer of the source/drain feature. The dopant can diffuse, along the dislocations, from the bulk layer into the barrier layer and further piles to the inner spacer. Therefore, a reduction of the junction overlap may be achieved and the performance of the semiconductor device may be enhanced without further scaling down the semiconductor devices.

FIG. 1 is a perspective view of a semiconductor structure, in accordance with some embodiments. A semiconductor structure 100 is provided, as shown in FIG. 1, in accordance with some embodiments. The semiconductor structure 100 includes a substrate 102 and a fin structure 104 over the substrate 102, in accordance with some embodiments. Although one fin structure 104 is illustrated in FIG. 1, more than one fin structures 104 may be formed over the semiconductor substrate 102.

For a better understanding of the semiconductor structure, X-Y-Z coordinate reference is provided in the figures of the present disclosure. X-axis and Y-axis are generally orientated along the lateral (or horizontal) directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The fin structure 104 includes a lower fin element 104L formed from a portion of the substrate 102 and an upper fin element formed from an epitaxial stack including alternating first semiconductor layers 106 and second semiconductor layer 108, in accordance with some embodiments. The fin structure 104 extends in X direction, in accordance with some embodiments. That is, the fin structure 104 has a longitudinal axis parallel to X direction, in accordance with some embodiments. X direction may also be referred to as the channel-extending direction. The current of the resulting semiconductor device (i.e., nanostructure transistor) flows in X direction through the channel.

The fin structure 104 includes a channel region CH and source/drain regions SD, where the channel region CH is defined between the source/drain regions SD, in accordance with some embodiments. In this disclosure, a source/drain refers to a source and/or a drain. It is noted that in the present disclosure, a source and a drain are interchangeably used and the structures thereof are substantially the same. FIG. 1 shows one channel region CH and two source/drain regions SD for illustrative purpose and is not intended to be limiting. The number of the channel region CH and the source/drain regions may be dependent on the semiconductor device design demand and/or performance consideration. Gate structure or gate stack (not shown) will be formed with a longitudinal axis parallel to Y direction and extending across and/or surrounds the channel region CH of the fin structure 104. Y direction may also be referred to as a gate-extending direction.

FIG. 1 further illustrates a reference cross-section that is used in later figures. Cross-section X-X is in a plan parallel to the longitudinal axis of the fin structure 104 (X direction) and through the fin structure 104, in accordance with some embodiments. Cross-section Y-Y is in a plan parallel to the longitudinal axis of the gate structure (Y direction) and across the source/drain region SD of the fin structure 104, in accordance with some embodiments.

FIGS. 2A-1 through 2L-2 are cross-sectional views illustrating the formation of a semiconductor structure at various intermediate stages, in which the figures ending with "-1" (such as FIG. 2A-1) are cross-sectional views corresponding to cross-section X-X shown in FIG. 1, and the figures ending with "-2" (such as FIG. 2A-2) are cross-sectional views corresponding to cross-section Y-Y shown in FIG. 1, in accordance with some embodiments. FIGS. 2H-2I are cross-sectional views corresponding to cross-section X-X shown in FIG. 1 and illustrate intermediate stages of an epitaxial growth process for forming a source/drain feature, in accordance with some embodiments of the disclosure.

Figures 2, 2C:
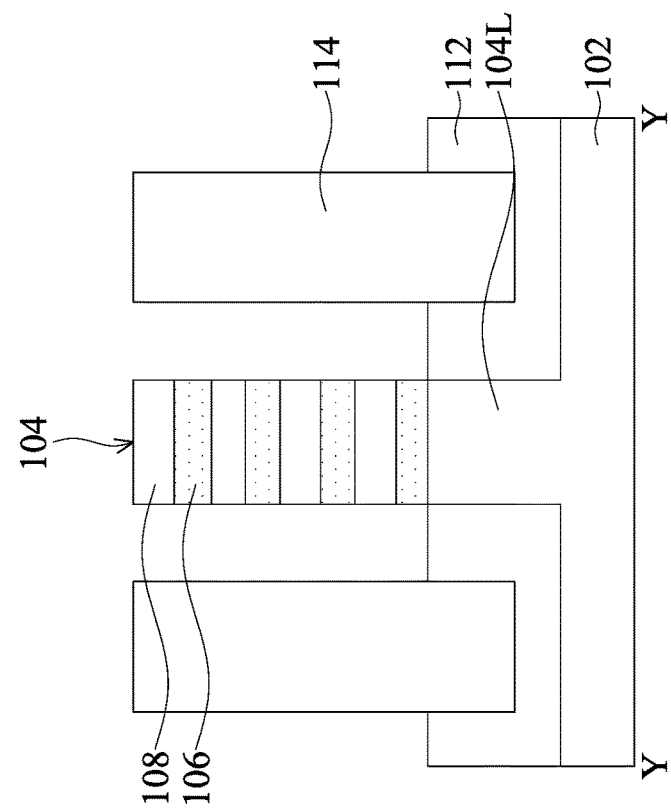
Figures 1, 2C:
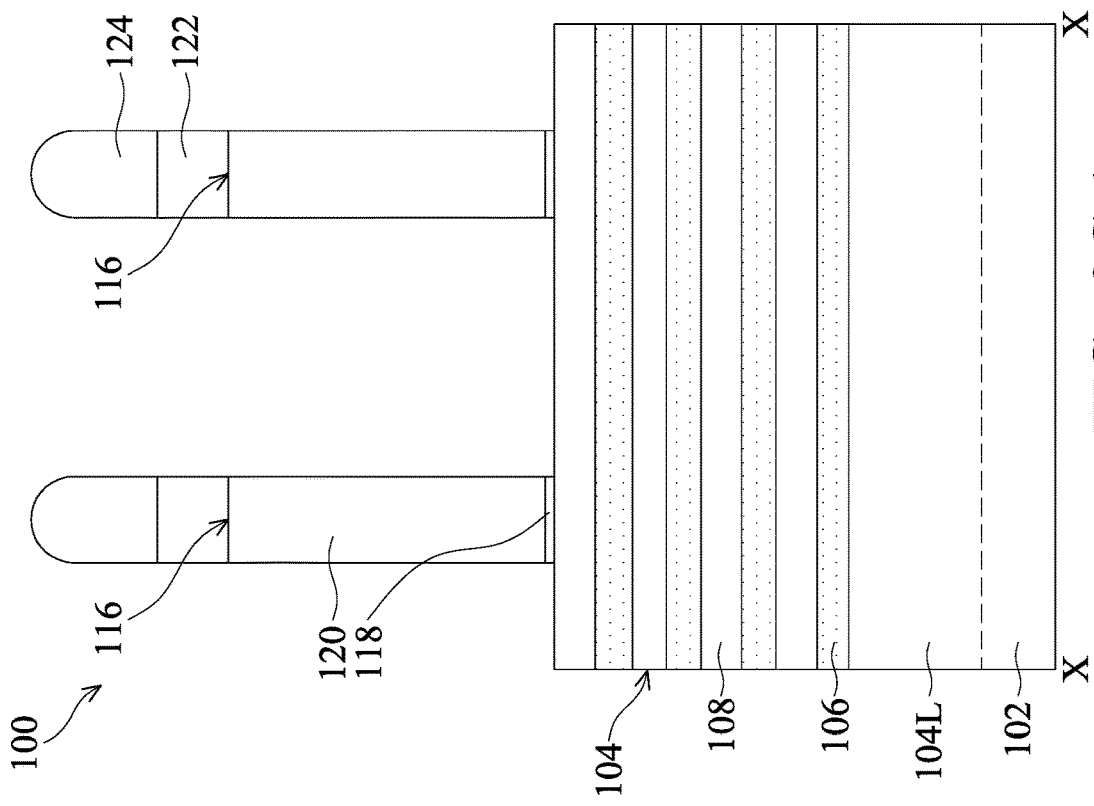

FIGS. 2A-1 and 2A-2 are cross-sectional views of a semiconductor structure 100 after the formation of fin structure 104, in accordance with some embodiments.

A semiconductor structure 100 including a substrate 102 and a fin structure 104 is provided, as shown in FIGS. 2A-1 and 2A-2, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the fin structure 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material with a different composition than the first semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity.

In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. For example, the second semiconductor layers 108 are undoped such as intrinsic silicon. For example, an impurity (or an n-type dopant and/or a p-type dopant) in the second semiconductor layers 108 has a concentration of less than about $10^{14}$ cm$^{-3}$. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, in accordance with some embodiments. The second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate stack (not shown) will be formed across and wrap around the nanostructures, in accordance with some embodiments.

In some embodiments, the thickness of each of the first semiconductor layers 106 is in a range from about 5 nm to about 20 nm. In some embodiments, the thickness of each of the second semiconductor layers 108 is in a range from about 5 nm to about 20 nm. The thickness of the second semiconductor layers 108 may be greater than, equal to, or less than the first semiconductor layers 106, which may depend on the amount of gate materials to be filled in spaces where the first semiconductor layers 106 are removed. Although four first semiconductor layers 106 and four second semiconductor layers 108 are shown in FIGS. 2A-1 and 2A-2, the numbers are not limited to four, and can be 1, 2, 3 or more than 4, and is less than 20. By adjusting the number of the semiconductor layers, a driving current of the resulting semiconductor device can be adjusted.

The epitaxial stack (including the first semiconductor layers 106 and the second semiconductor layers 108) are patterned into the fin structure 104, in accordance with some embodiments. In some embodiments, the patterning process includes forming a patterned hard mask layer 110 over the epitaxial stack. The patterned hard mask layer 110 is made of single layer or multiple layers of dielectric material. An etching process is then performed to remove portions of the epitaxial stack and underlying substrate 102 uncovered by the patterned hard mask layer 110, thereby forming trenches and the fin structure 104 protruding from between the trenches, in accordance with some embodiments. The etching process may be an anisotropic etching process, e.g., dry plasma etching.

The portion of the substrate 102 protruding from between the trenches forms a lower fin element 104L of the fin structure 104, in accordance with some embodiments. A remainder of the epitaxial stack (including the first semiconductor layers 106 and the second semiconductor layers 108) forms the upper fin element of the fin structure 104 over the lower fin element 104L, in accordance with some embodiments.

In some embodiments, the fin structure 104 extend in X direction. That is, the fin structure 104 has longitudinal axis parallel to X direction, in accordance with some embodiments. FIG. 2A-2 shows one fin structure 104 and is not intended to be limiting. The number of the fin structures 104 may be dependent on the semiconductor device design demand and/or performance consideration. In some embodiments, the fin structure 104 may also referred to as semiconductor fin structure and is configured as active region of the semiconductor structure 100.

FIGS. 2B-1 and 2B-2 are cross-sectional views of a semiconductor structure 100 after the formation of an isolation structure 112 and dielectric fin structures 114, in accordance with some embodiments.

An isolation structure 112 is formed to surround the lower fin element 104L of the fin structure 104, and dielectric fin structures 114 are formed over the isolation structure 112, as shown in FIG. 2B-2, in accordance with some embodiments. An insulating material for the isolation structure 112 is conformally formed along the sidewalls and the upper surface of the fin structure 104 and the upper surface of the substrate 102, in accordance with some embodiments. The insulating material partially fills the trenches, in accordance with some embodiments.

In some embodiments, the insulating material for the isolation structure 112 includes silicon oxide ($SiO_2$), silicon nitride (SiN), silicon oxynitride (SiON), another suitable insulating material, multilayers thereof, and/or a combination thereof. In some embodiments, the insulating material is formed using chemical vapor deposition (CVD) such as low pressure CVD (LPCVD), plasma enhanced CVD (PECVD), high density plasma CVD (HDP-CVD), high aspect ratio process (HARP), flowable CVD (FCVD), atomic layer deposition (ALD), another suitable technique, and/or a combination thereof. In some embodiments, the insulating material may be bi-layered or multi-layered, for example, a lining layer and a bulk layer over the lining layer.

A dielectric material for the dielectric fin structures 114 is then formed over the insulating material and overfills the remainder of the trenches, in accordance with some embodiments. In some embodiments, the dielectric material for the dielectric fin structures 114 includes silicon nitride (SiN) silicon carbon nitride (SiCN), silicon oxynitride (SiON), silicon carbon oxynitride SiCON, hafnium oxide ($HfO_2$), lanthanum oxide ($La_2O_3$), aluminum oxide ($Al_2O_3$), zirconium oxide ($ZrO_2$), another suitable insulating material, multilayers thereof, and/or a combination thereof. In some embodiments, the dielectric material is formed using CVD such as LPCVD, PECVD, HDP-CVD, HARP, FCVD, ALD, another suitable technique, and/or a combination thereof.

Portions of the dielectric material for the dielectric fin structures 114 and the insulating material for the isolation structure 112 formed above the fin structure 104 are removed until the upper surface of the fin structure 104 is exposed. In some embodiments, the removal process is an etching-back process or a chemical mechanical polishing (CMP) process. The pattern hard mask layer 110 may be also removed. The remainder of the dielectric material forms dielectric fin structures 114, as shown in FIG. 2B-2, in accordance with some embodiments of the disclosure.

Afterward, the insulating material is recessed using an etch process (such as dry plasma etching and/or wet chemical etching) to form gaps between the fin structure 104 and the dielectric fin structures 114, in accordance with some embodiments. The gaps expose the upper fin element, in accordance with some embodiments. The remainder of the insulating material forms isolation structure 112, as shown in FIG. 2B-2, in accordance with some embodiments of the disclosure. The isolation structure 112 surrounds lower fin element 104L and lower portions of the dielectric fin structures 114, in accordance with some embodiments.

The isolation structure 112 is configured to electrically isolate active regions (e.g., the fin structure 104) of the semiconductor structure 100 and is also referred to as shallow trench isolation (STI) feature, in accordance with some embodiments. In some embodiments, the isolation structure 112 includes vertical portions separating the fin structure 104 from the dielectric fin structures 114 and horizontal portions extending below the dielectric fin structures 114. In some embodiments, the dielectric fin structures 114 extend in X direction. That is, the dielectric fin structures 114 have longitudinal axes parallel to X direction and substantially parallel to the fin structure 104, in accordance with some embodiments. In some embodiments, the dielectric fin structures 114 are referred to as hybrid fin structures.

FIGS. 2C-1 and 2C-2 are cross-sectional views of a semiconductor structure 100 after the formation of dummy gate structures 116, in accordance with some embodiments.

Dummy gate structures 116 are formed over the semiconductor structure 100, as shown in FIG. 2C-1, in accordance with some embodiments. The dummy gate structures 116 extend across and surround the channel regions of the fin structure 104 to define the channel regions and the source/drain regions, in accordance with some embodiments. The dummy gate structures 116 are configured as a sacrificial structure and will be replaced with a final gate stack, in accordance with some embodiments. In some embodiments, the dummy gate structures 116 extend in Y direction. That is, the dummy gate structures 116 have longitudinal axes parallel to Y direction, in accordance with some embodiments. FIG. 2C-1 shows two dummy gate structures 116 for illustrative purpose and is not intended to be limiting. The number of the dummy gate structures 116 may be dependent on the semiconductor device design demand and/or performance consideration.

The dummy gate structures 116 includes a dummy gate dielectric layer 118 and a dummy gate electrode layer 120 formed over the dummy gate dielectric layer 118, as shown in FIG. 2C-1, in accordance with some embodiments. In some embodiments, the dummy gate dielectric layer 118 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 120 is made of semiconductor material such as polysilicon, poly-silicon germanium. In some embodiments, the dummy gate electrode layer 120 is made of a conductive material such as metallic nitrides, metallic silicides, metals, and/or a combination thereof. In some embodiments, the material for the dummy gate electrode layer 120 is formed using CVD, another suitable technique, and/or a combination thereof.

In some embodiments, the formation of the dummy gate structures 116 includes globally and conformally depositing a dielectric material for the dummy gate dielectric layer 118 over the semiconductor structure 100, depositing a material for the dummy gate electrode layer 120 over the dielectric material, planarizing the material for the dummy gate electrode layer 120, and patterning the dielectric material and the material for the dummy gate electrode layer 120 into the dummy gate structures 116. The patterning process includes forming patterned hard mask layers 122 and 124 over the material for the dummy gate electrode layer 120 to cover the channel regions of the fin structure 104, in accordance with some embodiments. For example, the patterned hard mask layer 122 is made of nitride such as silicon nitride, and the patterned hard mask layer 124 is made of oxide such as silicon oxide. The material for the dummy gate electrode layer 120 and the dielectric material, uncovered by the patterned hard mask layers 122 and 124, is etched away until the source/drain regions of the fin structure 104 are exposed, in accordance with some embodiments.

Figures 1, 2, 2D:
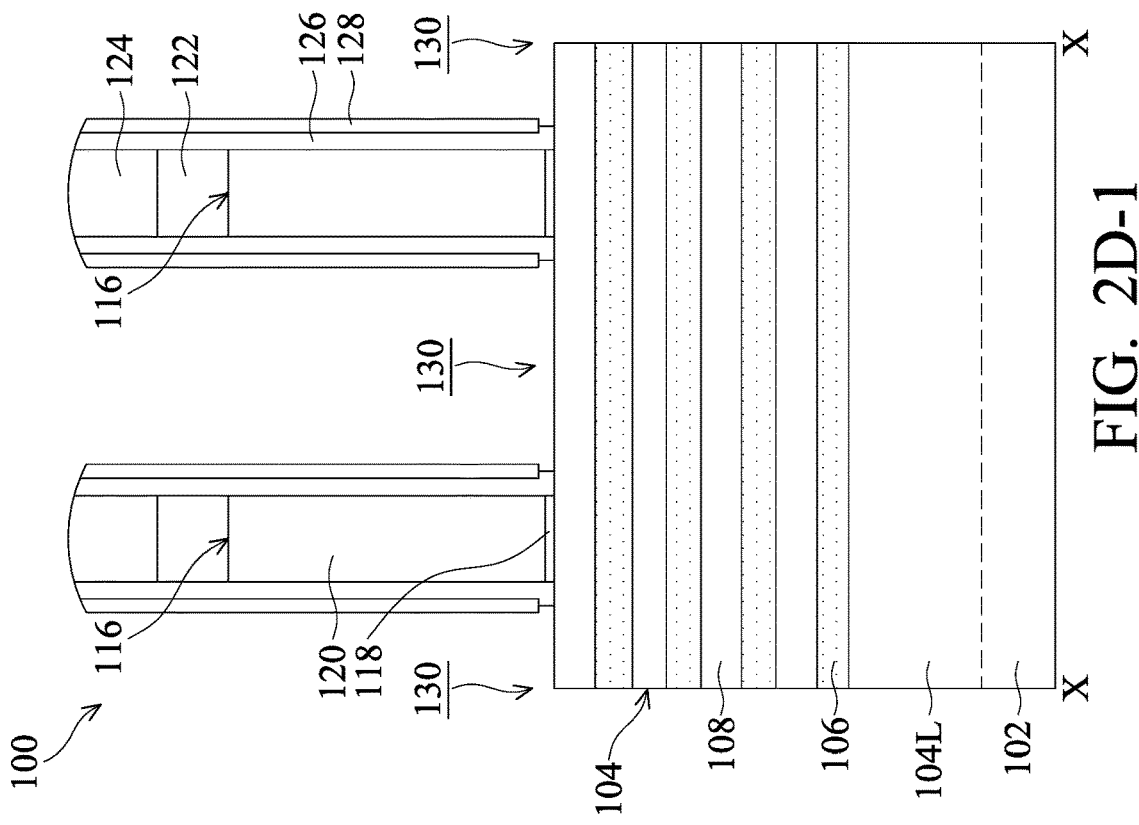

FIGS. 2D-1 and 2D-2 are cross-sectional views of a semiconductor structure 100 after the formation of gate spacer layers 126 and 128, in accordance with some embodiments.

The gate spacer layers 126 and 128 are sequentially formed over the semiconductor structure 100, as shown in FIGS. 2D-1, in accordance with some embodiments. The gate spacer layers 126 and 128 are used to offset the subsequently formed source/drain features and separate the source/drain features from the gate structure, in accordance with some embodiments.

In some embodiments, the gate spacer layers 126 and 128 are made of dielectric material, such as a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the formation of the gate spacer layers 126 and 128 includes globally and conformally depositing a dielectric material for the gate spacer layer 126 to cover the sidewalls of the dummy gate structures 116, the sidewalls of the patterned hard mask layers 122, and the upper surfaces and the sidewalls of the patterned hard mask layers 124. In some embodiments, the dielectric layer also covers the upper surface and the sidewalls of the upper fin element, the upper surfaces and the sidewalls of the dielectric fin structures 114, and the upper surface of the isolation structure 112, in accordance with some embodiments. A dielectric material for the gate spacer layer 128 is then formed over the dielectric material for the gate spacer layer 126. The deposition processes may be ALD, CVD (such as LPCVD, PECVD, HDP-CVD, HARP, and FCVD), another suitable method, and/or a combination thereof.

Afterward, one or more etching process is performed to removes portions of the gate spacer layers 126 and 128 formed on the upper surfaces of the patterned hard mask layers 124, the upper surface and the sidewalls of the upper fin element, the upper surfaces and the sidewalls of the dielectric fin structures 114, and the upper surface of the isolation structure 112, in accordance with some embodiments. The one or more etching process may be an anisotropic etching process such as dry plasma etching, an isotropic etching process such as dry chemical etching, remote plasma etching or wet chemical etching, and/or a combination thereof. In some embodiments, the etching processes are performed without an additional photolithography process. Remaining portions of the dielectric layers on the sidewalls of the dummy gate structures 116 forms the gate spacer layers 126 and 128, in accordance with some embodiments.

In some embodiments, the gate spacer layers 126 and 128 are made of low-k dielectric materials. For example, the dielectric constant (k) values of the gate spacer layers 126 and 128 may be lower than the k-value of silicon oxide (SiO), such as lower than 4.2, equal to or lower than about 3.9, such as in a range from about 3.5 to about 3.9.

In some embodiments, the gate spacer layer 126 and the gate spacer layer 128 are made of different materials and have different dielectric constant values. For example, the gate spacer layers 120 is a SiOCN layer and the gate spacer layers 122 is a Si(O)CN layer. The oxygen concentration in the SiOCN layer may be greater than the oxygen concentration in the Si(O)CN layer. In some embodiments, a bottom portion of the gate spacer layer 126 below the gate spacer layer 128 has an edge that is indented from the sidewall (an edge) of the gate spacer layer 128, thereby forming an undercut.

FIGS. 2E-1 and 2E-2 are cross-sectional views of a semiconductor structure 100 after the formation of source/drain recesses 130, in accordance with some embodiments.

An etching process is performed to recess the source/drain regions of the fin structure 104, thereby forming source/drain recesses 130, as shown in FIGS. 2E-1 and 2E-2, in accordance with some embodiments. The etching process may be an anisotropic etching process such as dry plasma etching, an isotropic etching process such as dry chemical etching, remote plasma etching or wet chemical etching, and/or a combination thereof. The etching process is performed using the gate spacer layers 126 and 128 and the dummy gate structures 116 as etch mask to recess the source/drain regions of the fin structure 104 such that the source/drain recess 130 are formed self-aligned on the opposite sides of the dummy gate structures 116, in accordance with some embodiments. In some embodiments, the etching processes are performed without an additional photolithography process.

The source/drain recesses 130 penetrate through the upper fin element of the fin structure 104, in accordance with some embodiments. The bottom surfaces of the source/drain recesses 130 may extend to a position substantially level with or below the upper surface of the isolation structure 112, in accordance with some embodiments.

Figures 2, 2F:
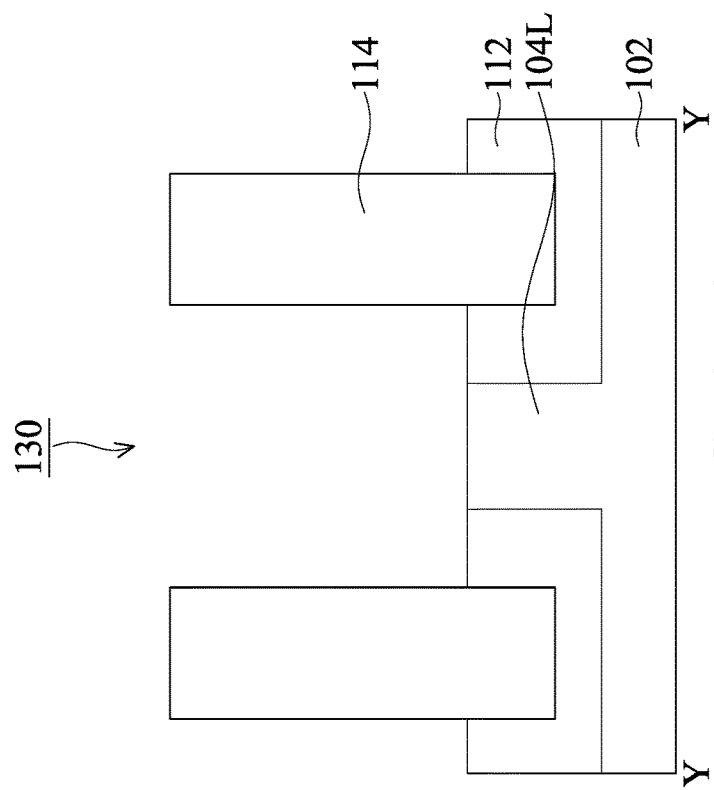
Figures 1, 2F:
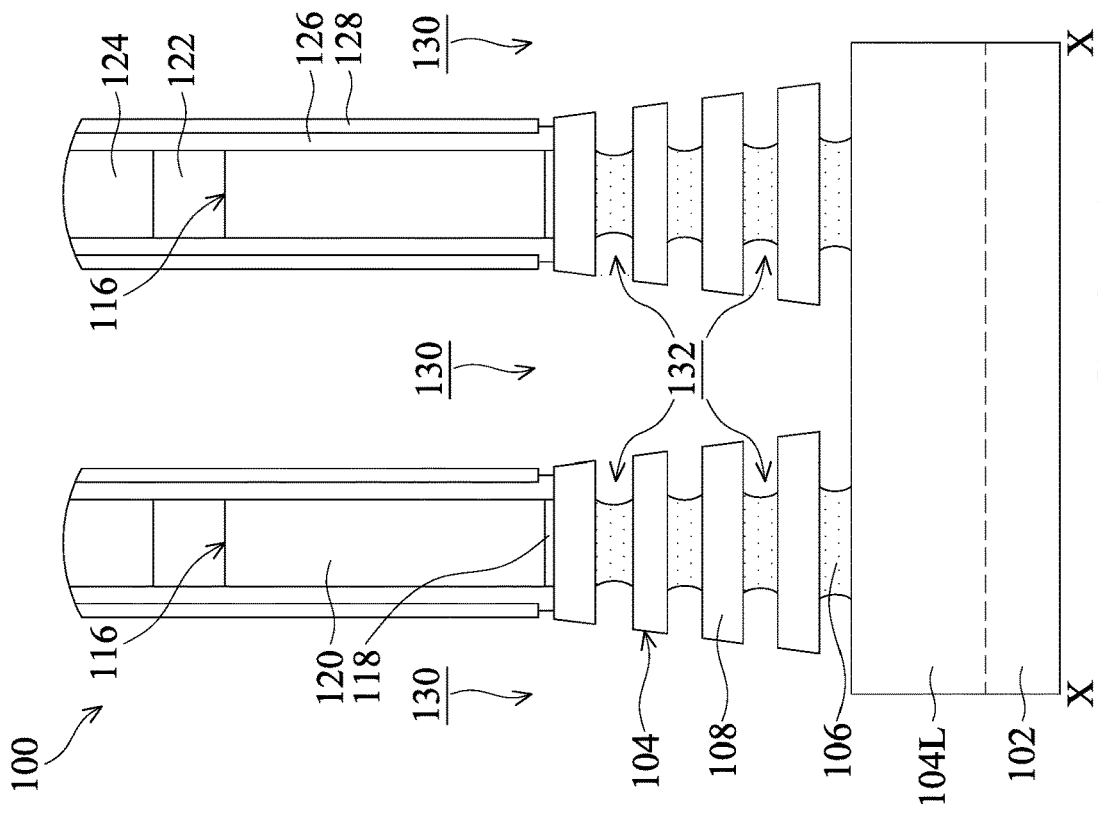
Figure 2H:
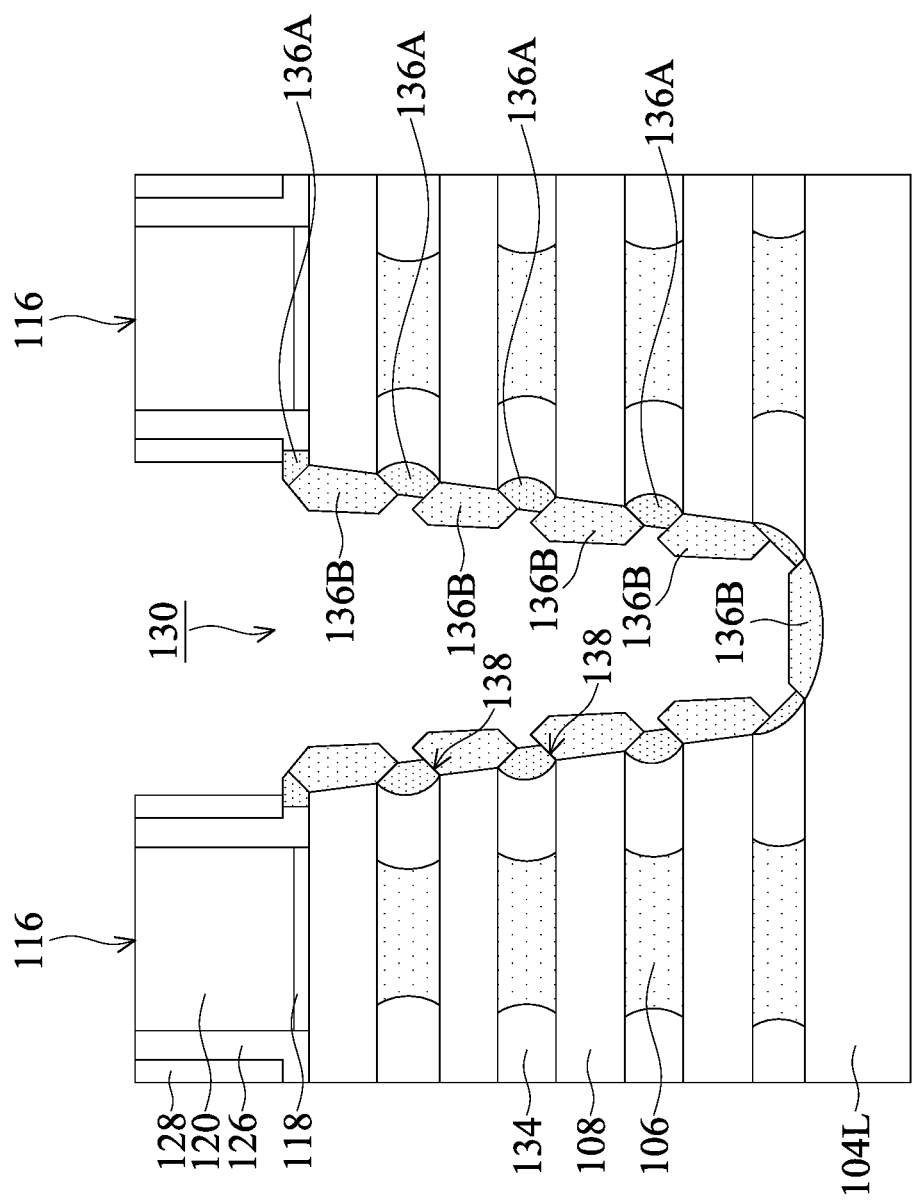
FIGS. 2H-2I are cross-sectional views illustrating intermediate stages of an epitaxial growth process for forming a source/drain feature, in accordance with some embodiments of the disclosure.
Figure 2I:
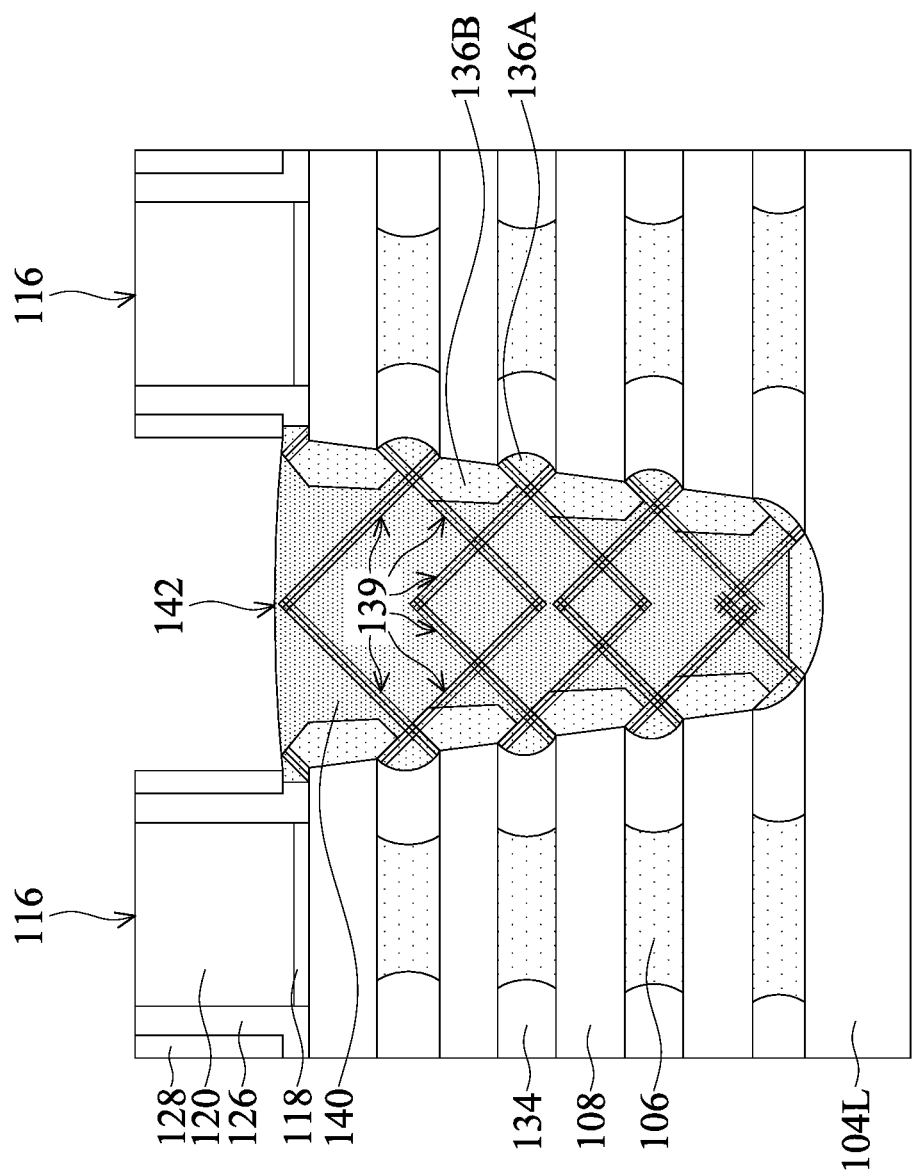

FIGS. 2F-1 and 2F-2 are cross-sectional views of a semiconductor structure 100 after the formation of notches 132, in accordance with some embodiments.

An etching process is performed on the semiconductor structure 100 to laterally recess, from the source/drain recesses 130, the first semiconductor layers 106 of the fin structure 104 to form notches 132, as shown in FIG. 2F-1, in accordance with some embodiments. In some embodiments, the etching process is an isotropic etching such as dry chemical etching, remote plasma etching, wet chemical etching, another suitable technique, and/or a combination thereof. In some embodiments, in the etching process, the first semiconductor layers 106 have a greater etching rate (or etching amount) than the second semiconductor layers 108. The notches 132 are located between adjacent second semiconductor layers 108 and between the lowermost second semiconductor layer 108 and the lower fin element 104L, in accordance with some embodiments.

In some embodiments, the notches 132 extend, from the source/drain regions toward the channel region, directly below the gate spacer layers 126 and 128, in accordance with some embodiments. In some embodiments, the recessed first semiconductor layers 106 has side surfaces (exposed from the notches 132) that are curved, (e.g., concave surface toward the channel region).

FIGS. 2G-1 and 2G-2 are cross-sectional views of a semiconductor structure 100 after the formation of inner spacer layers 134, in accordance with some embodiments.

Inner spacer layers 134 are formed in the notches 132 to abut the side surfaces of the recessed first semiconductor layers 106, as shown in FIG. 2G-1, in accordance with some embodiments. The inner spacer layers 134 interpose subsequently formed source/drain features and gate stack to avoid the source/drain features and the gate stack from being in direct contact and are configured to reduce the parasitic capacitance between the metal gate electrode and the source/drain features (i.e. Cgs and Cgd), in accordance with some embodiments.

In some embodiments, the inner spacer layers 134 are made of dielectric material, such as a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 134 are made of low-k dielectric materials. For example, the dielectric constant (k) values of the inner spacer layers 134 may be lower than a k-value of silicon oxide (SiO), such as lower than 4.2, equal to or lower than about 3.9, such as in a range from about 3.5 to about 3.9.

In some embodiments, the inner spacer layers 134 are formed by globally and conformally depositing a dielectric material for the inner spacer layers 134 over the semiconductor structure 100 to fill the notches 132, and then etching back the dielectric material to remove the dielectric material outside the notches 132. The dielectric material remaining in the notches 132 forms the inner spacer layers 134, in accordance with some embodiments. In some embodiments, the deposition process includes ALD, CVD (such as PECVD, LPCVD or HARP), another suitable technique, and/or a combination thereof. In some embodiments, the etching-back process includes an anisotropic etching process such as dry plasma etching, an isotropic etching process such as dry chemical etching, remote plasma etching or wet chemical etching, and/or a combination thereof.

Afterward, an epitaxial growth process is performed to form source/drain features 142 in the source/drain recesses 130, in accordance with some embodiments. In some embodiments, the epitaxial growth process may be MBE, MOCVD, or VPE, another suitable technique, or a combination thereof. FIGS. 2H and 2I illustrate intermediate stages of an epitaxial growth process for forming a source/drain feature 142, in accordance with some embodiments.

The epitaxial growth process includes forming barrier layers 136A on the dielectric surfaces of the inner spacer layers 134 and the bottom portion of the gate spacer layer 126 and forming barrier layers 136B on semiconductor surfaces of the second semiconductor layers 108 and the lower fin element 104L to partially fill the source/drain recess 130, as shown in FIG. 2H, in accordance with some embodiments. The epitaxial growth process also includes forming a bulk layer 140 on the barrier layers 136A and 136B to fill the remainder of the source/drain recess 130, as shown in FIG. 2I, in accordance with some embodiments. The barrier layers 136A and 136B and the bulk layer 140 combine to form the source/drain feature 142, in accordance with some embodiments.

In some embodiments, the source/drain features 142 are made of any suitable semiconductor material for n-type semiconductor devices or p-type semiconductor devices. In some embodiments wherein the fin structure 104 is to be formed as an re-channel nanostructure device (such as n-channel GAA FET), the barrier layers 136A and 136B and the bulk layer 140 of the source/drain feature 142 are made of semiconductor material such as SiP, SiAs, SiCP, SiC, Si, GaAs, another suitable semiconductor material, or a combination thereof. In some embodiments, the source/drain feature 142 is doped with the n-type dopant during the epitaxial growth process. For example, the n-type dopant may be phosphorous (P) or arsenic (As). For example, the barrier layers 136A and 136B and the bulk layer 140 of the source/drain feature 142 may be the epitaxially grown Si doped with phosphorous to form silicon:phosphor (Si:P) source/drain features and/or arsenic to form silicon:arsenic (Si:As) source/drain feature.

In some embodiments wherein the fin structure 104 is to be formed as a p-channel nanostructure device (such as p-channel GAA FET), the barrier layers 136A and 136B and the bulk layer 140 of the source/drain feature 142 is made of semiconductor material such as SiGe, Si, GaAs, another suitable semiconductor material, or a combination thereof. In some embodiments, the source/drain feature 142 is doped with the p-type dopant during the epitaxial growth process. For example, the p-type dopant may be boron (B) or $BF_2$. For example, the barrier layers 136A and 136B and the bulk layer 140 of the source/drain feature 142 may be the epitaxially grown SiGe doped with boron (B) to form silicon germanium:boron (SiGe:B) source/drain feature.

In some embodiments, the barrier layers 136A and 136B are doped with the same conductivity-type dopant as that doped in the bulk layer 140. In some embodiments, the average concentration of the dopant in the barrier layers 136A is substantially the same as the average concentration of the dopant in the barrier layers 136B. The average concentration of the dopant in the bulk layer 140 is higher than the average concentration of the dopant in the barrier layers 136A and 136B, e.g., by 2 orders, in accordance with some embodiments.

In some embodiments, the barrier layers 136A and 136B with relatively a low dopant concentration are configured to block the dopant from the bulk layer 140 with relatively high dopant concentration from diffusing into the second semiconductor layers 108 during a following anneal process. In some embodiments, the bulk layer 140 with a relatively high dopant concentration may reduce contact resistance.

In some embodiments wherein the source/drain feature 142 is doped with the n-type dopant such as P, the dopant in the barrier layers 136A and 136B of the source/drain feature 142 has an average concentration in a range from about $1 \times 10^{19}$ cm$^{-3}$ to about $6 \times 10^{19}$ cm$^{-3}$, and the dopant in the bulk layer 140 of the source/drain feature 142 has an average concentration in a range from about $1 \times 10^{21}$ cm$^{-3}$ to about $6 \times 10^{21}$ cm$^{-3}$.

In some embodiments wherein the source/drain feature 142 is doped with the p-type dopant such as B, the dopant in the barrier layers 136A and 136B of the source/drain feature 142 has an average concentration in a range from about $1.5 \times 10^{19}$ cm$^{-3}$ to about $9 \times 10^{19}$ cm$^{-3}$, and the dopant in the bulk layer 140 of the source/drain feature 142 has an average concentration in a range from about $1.5 \times 10^{21}$ cm$^{-3}$ to about $9 \times 10^{21}$ cm$^{-3}$.

In some embodiments, the epitaxial growth process for forming the source/drain 142 is a cyclic deposition etch (CDE) epitaxy. For example, CDE includes periodic steps, in which the semiconductor structure 100 is exposed to a pulse of precursors for deposition and doping and an etchant gas for a first period of time, followed by a second period of time wherein the semiconductor structure 100 is exposed to the etchant gas without the precursors, followed by a third period of time wherein the semiconductor structure 100 is again exposed to the pulse of the precursors for deposition and doping and an etchant gas, and so on, until a desired epitaxial layer thickness is achieved.

Figure 5B:
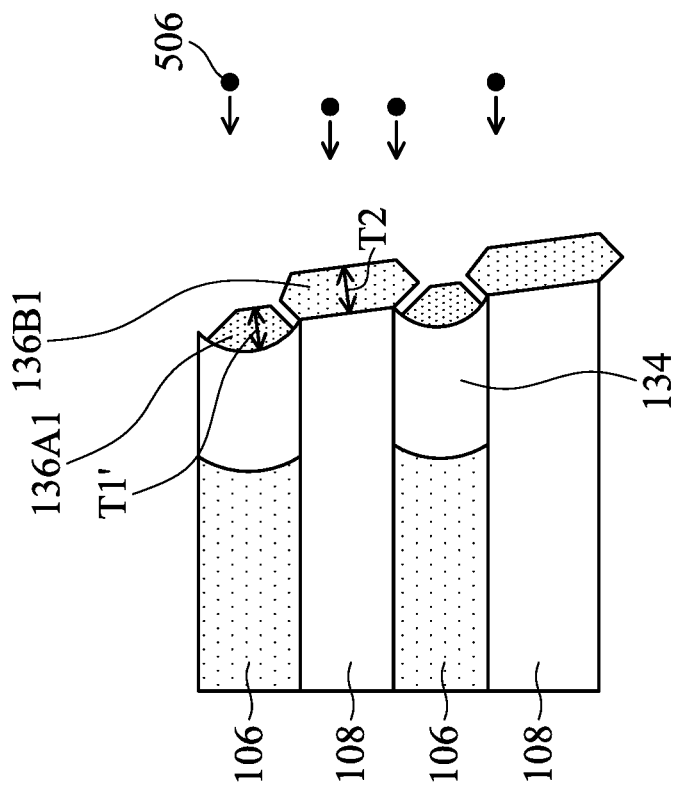
FIGS. 5A-5B are cross-sectional views illustrating one cycle of a cyclic deposition etch (CDE) epitaxy, in accordance with some embodiments of the disclosure.
Figure 5A:
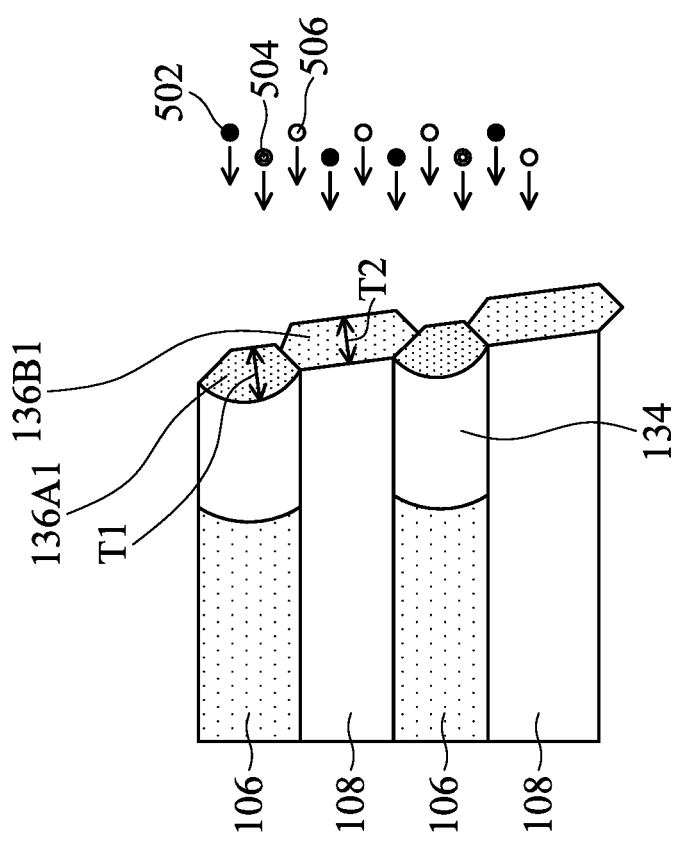

FIGS. 5A-5B are cross-sectional views of a portion of the semiconductor structure 100 to illustrate one cycle of the cyclic deposition etch epitaxy for forming the source/drain feature 142, in accordance with some embodiments of the disclosure.

The semiconductor structure 100 is placed in a processing chamber and a cyclic deposition etch epitaxy is performed in the processing chamber, in accordance with some embodiments. FIG. 5A illustrates a deposition step of the cyclic deposition etch epitaxy, wherein a first layer 136A1 of epitaxial material of the barrier layer 136A and a first layer 136B1 of epitaxial material of the barrier layer 136B are deposited, in accordance with some embodiments.

The semiconductor structure 100 is exposed to a continuous flow of a precursor 502 for deposition (e.g., silicon-containing precursor such as SiH$_4$ and/or dichlorosilane (DCS) gas), a precursor 504 for doping (e.g., PH$_3$, PF$_3$, and/or PF$_5$ for n-type; or BF$_3$, B$_2$H$_6$, and/or BCl$_3$ for p-type) and an etchant gas 506 (e.g., Cl$_2$ or HCl), as shown in FIG. 5A, in accordance with some embodiments. The etchant gas may be configured to continuously and selectively remove amorphous portions of the epitaxial material from the substrate. In some embodiment, in the deposition step, the first layer 136A1 of epitaxial material of the barrier layer 136A is deposited with a thickness T1, and the first layer 136B1 of epitaxial material of the barrier layer 136B deposited with a thickness T2.

FIG. 5B illustrates a deposition step of the cyclic deposition etch epitaxy after the deposition step of FIG. 5A, wherein the source of the precursors (such as 502 and 504) for deposition and doping have been turned off to allow the continuous flow of etchant gas 506 to selectively etch the first layer 136A1 of epitaxial material of the barrier layer 136A. The inner spacer layer 134 and the second semiconductor layer 108 provide the surfaces having different types of bonding for the barrier layers 136A and 136B. For example, the dielectric surface of the inner spacer layer 134 may provide a nitrogen dangling bond, and thus the epitaxial material of the barrier layer 136A, formed on the inner spacer layer 134, is easier to be removed during the etching step. That is, the etching amount (or etching rate) of the barrier layer 136A is greater than the etching amount (or etching rate) of the barrier layer 136B, in accordance with some embodiments.

In some embodiment, the as-etched first layer 136A1 of the epitaxial material of the barrier layer 136A has thickness T1', and the thickness T1' is about 0.2 to about 0.7 of the thickness T1. In some embodiment, the as-etched first layer 136B2 of epitaxial material of the barrier layer 136B has thickness T2', and the thickness T2' is about 0.7 to about 1 of the thickness T2.

The cycle of the deposition and the etching shown in FIGS. 5A-5B may repeat several times, thereby forming the barrier layers 136A and 136B shown in FIG. 2H with the desired thickness and further forming the bulk layer 140 shown in FIG. 2I to fill the source/drain recess 130. The barrier layers 136A and 136B and the bulk layer 140 may be deposited with different growth rates by controlling process parameters such as the flow rates of the precursors for deposition and/or the etchant gas, in accordance with some embodiments. For example, the bulk layer 140 is deposited with a higher growth rate than the barrier layers 136A and 136B. In addition, the concentration (e.g., mole fraction) of the doping precursor during the deposition of the bulk layer 140 is higher than the concentration of the doping precursor during the deposition of the barrier layers 136A and 136B. In addition, the barrier layers 136A and 136B may be deposited in a conformal manner, and the bulk layer 140 may be deposited in a bottom-up manner, which may be by controlling process parameters such as the RF power and/or pressure of the etchant step.

In some embodiments, the epitaxial material is also deposited such as on the gate spacer layer 128, the dielectric fin structures 114, and/or other dielectric layers during the deposition step of the CDE, and substantially completely removed in the following etching step. The epitaxial material of barrier layers 136A, formed on the inner spacer layers 134, is deposited within the narrow source/drain recess 130, and thus remains without being completely removed in the etching step, in accordance with some embodiments.

Referring back to FIG. 2H, the barrier layers 136A and 136B have different crystalline structures because the surfaces on which the barrier layers 136A and 136B are respectively grown have different crystalline structures, in accordance with some embodiments. Once the barrier layers 136A and the barrier layers 136B are grown to contact (merge with) each other, a mismatch of the crystalline structures may cause the formation of crystalline defects (such as dislocations) at the interfaces 138 between the barrier layers 136A and the barrier layers 136B. In some embodiments, more than one dislocation 142 are formed at one interface 138.

As the bulk layer 140 grows, the dislocations keep extends into the bulk layer 140, as shown in FIG. 2I, in accordance with some embodiments. The extended dislocations are denoted as dislocations 139. In some embodiments, because the etching steps of the cyclic deposition etch epitaxy confines the size of the barrier layer 136A, the dislocations 139 start from the sidewalls of the inner spacer layers 134 and propagate into the interior of the bulk layer 140.

In some embodiments, the lattice constants of the source/drain feature 142 are different than the lattice constant of the second semiconductor layers 108, such that the channel regions of the second semiconductor layers 108 can be strained or stressed by the source/drain feature 142 to improve carrier mobility of the semiconductor device and enhance the device performance.

In some embodiments, the growth of the source/drain features 142 are confined by the dielectric fin structures 114 (shown in FIG. 2G-2). The lateral growth of the source/drain features 142 are confined by dielectric fin structures 114, which may reduce the parasitic capacitance of the resulting semiconductor device.

Afterward, an anneal process is performed on semiconductor structure 100 to activate the dopant in the source/drain feature 142, in accordance with some embodiments. During the anneal process, the dislocations 139 provide diffusion paths such that the dopant in the bulk layer 140 with high dopant concentration can diffuse along the dislocations 139 and into the barrier layer 136A, in accordance with some embodiments. The dopant further piles to the interfaces between the inner spacer layers 134 and the barrier layer 136A and to the interfaces between the gate spacer layers 126 and the barrier layer 136A, in accordance with some embodiments. In some embodiments, the anneal process is performed at a temperature in a range from about 1050° C. to about 1125° C. for a duration in a range from about 3 minutes to about 10 minutes.

Figures 4A, 4B, 4C:
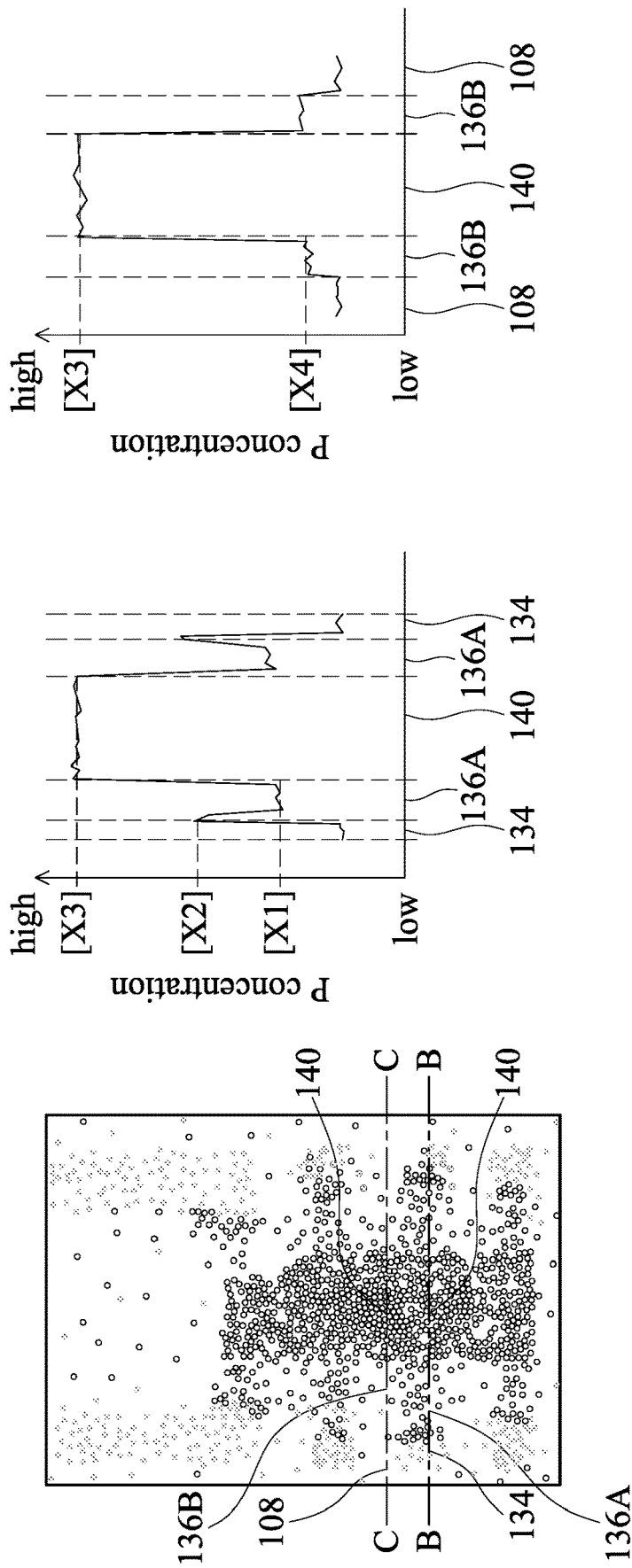
FIG. 4A is a schematic view illustrating an experimental result to exhibit the distribution of the dopants in the source/drain feature, in accordance with some embodiments of the disclosure.
FIG. 4B illustrates a schematic concentration profile of the dopants in the source/drain feature along cross-section A-A shown in FIG. 4A, in accordance with some embodiments of the disclosure.
FIG. 4C illustrates a schematic concentration profile of the dopants in the source/drain feature along cross-section C-C shown in FIG. 4A, in accordance with some embodiments of the disclosure.

FIG. 4A is a schematic view illustrating an experimental result to exhibit the distribution of the dopants in the source/drain feature 142 after the anneal process, in accordance with some embodiments of the disclosure. In some embodiments where the gate spacer layers 126 and 128 and the inner spacer layers 134 contains nitrogen and the source/drain feature 142 is doped with phosphorus, the experimental result is analyzed and detected the sign by energy-dispersive X-ray spectroscopy (EDX) mapping. After the anneal process, the dopants (such as phosphorus) are more concentrated in the barrier layer 134A than in the barrier layer 134B, and piles up to the interface between the inner spacer layers 134 and the barrier layers 136A and to the interfaces between the gate spacer layers 126 and the barrier layer 136A, as shown in FIG. 4A, in accordance with some embodiments.

FIG. 4B illustrates a schematic concentration profile of the dopants in the source/drain feature 142 along cross-section B-B shown in FIG. 4A; FIG. 4C illustrates a schematic concentration profile of the dopants in the source/drain feature 142 along cross-section C-C shown in FIG. 4A, in accordance with some embodiments of the disclosure.

As shown in FIG. 4B, the dopant in the barrier layers 136A after the anneal process has a concentration X1 (substantially equal to the average concentration) that is higher than the average concentration of the dopant in the barrier layers 136A before the anneal process, in accordance with some embodiments.

In some embodiments wherein the source/drain feature 142 is doped with the n-type dopant such as P, the dopant in the barrier layers 136B of the source/drain feature 142 has an average concentration in a range from about $1 \times 10^{20}$ cm$^{-3}$ to about $6 \times 10^{20}$ cm$^{-3}$. In some embodiments wherein the source/drain feature 142 is doped with the p-type dopant such as B, the dopant in the barrier layers 136B of the source/drain feature 142 has an average concentration in a range from about $1.5 \times 10^{20}$ cm$^{-3}$ to about $9 \times 10^{20}$ cm$^{-3}$.

As shown in FIG. 4B, the dopant in the barrier layers 136A has a peak concentration X2 at the interface between the inner spacer layer 134 and the barrier layers 136A because the dopants pile up to the sidewalls of the inner spacer layers 134, in accordance with some embodiments. The peak concentration X2 is higher than the average concentration X1, in accordance with some embodiments.

In some embodiments wherein the source/drain feature 142 is doped with the n-type dopant such as P, the peak concentration X2 is in a range from about $1.5 \times 10^{20}$ cm$^{-3}$ to about $9 \times 10^{20}$ cm$^{-3}$. In some embodiments wherein the source/drain feature 142 is doped with the p-type dopant such as B, the peak concentration X2 is in a range from about $2 \times 10^{20}$ cm$^{-3}$ to about $1.2 \times 10^{21}$ cm$^{-3}$.

As shown in FIGS. 4B and 4C, the dopant in the in the bulk layer 140 after the anneal process has a concentration X3 (substantially equal to the average concentration) that is substantially the same as or slightly lower than the average concentration of the dopant in the bulk layer 140 before the anneal process, in accordance with some embodiments.

In some embodiments wherein the source/drain feature 142 is doped with the n-type dopant such as P, the dopant in the bulk layer 140 of the source/drain feature 142 has an average concentration in a range from about $1 \times 10^{21}$ cm$^{-3}$ to about $6 \times 10^{21}$ cm$^{-3}$. In some embodiments wherein the source/drain feature 142 is doped with the p-type dopant such as B, the dopant in the bulk layer 140 of the source/drain feature 142 has an average concentration in a range from about $1.5 \times 10^{21}$ cm$^{-3}$ to about $9 \times 10^{21}$ cm$^{-3}$.

As shown in FIG. 4C, the dopant in the barrier layers 136B after the anneal process has a concentration X4 (substantially equal to the average concentration) that is substantially the same as or slightly higher than the average concentration of the dopant in the barrier layers 136B before the anneal process, in accordance with some embodiments.

In some embodiments wherein the source/drain feature 142 is doped with the n-type dopant such as P, the dopant in the barrier layers 136B of the source/drain feature 142 has an average concentration in a range from about $1 \times 10^{19}$ cm$^{-3}$ to about $6 \times 10^{19}$ cm$^{-3}$. In some embodiments wherein the source/drain feature 142 is doped with the p-type dopant such as B, the dopant in the barrier layers 136B of the source/drain feature 142 has an average concentration in a range from about $1.5 \times 10^{19}$ cm$^{-3}$ to about $9 \times 10^{19}$ cm$^{-3}$.

As a result, after the annealing, the average concentration of the dopant in the barrier layers 136A is higher than the average concentration of the dopant in the barrier layers 136B, in accordance with some embodiments. Furthermore, the dopant in the barrier layers 136A has a peak concentration at the sidewalls of inner spacer layer 134 and the barrier layers 136A, in accordance with some embodiments.

Typically, in order to enhance the performance of the semiconductor devices, one of the design challenges of forming semiconductor devices is to continue to shrinks the scale of the semiconductor devices to reduce the junction overlap. However, as the scale of the semiconductor devices shrink, the difficulty of the manufacturing for forming the semiconductor devices significantly increases. In accordance with some embodiments of the present disclosure, the dopant diffuses, along the dislocations 139, from the bulk layer 140 of the source/drain feature 142 into the barrier layers 136A and further piles up to the surface of the inner spacer layers 134, and therefore the junction overlap of the resulting semiconductor device may reduce. As a result, the performance of the resulting semiconductor device may be enhanced, e.g., drain current (Id), saturation current (Isat), etc. without further scaling down the semiconductor devices.

In addition, because the concentration of the dopant in barrier layers 136B, which is in contact with the second semiconductor layers 108, keeps substantially the same or slightly increases after the anneal process, the dopant may not easily diffuse into the second semiconductor layers 108. Therefore, the performance of the resulting semiconductor device may not be negatively affected, e.g., drain induced barrier lowering (DIBL).

FIGS. 2J-1 and 2J-2 are cross-sectional views of a semiconductor structure 100 after the formation of a contact etching stop layer (CESL) 144 and an interlayer dielectric (ILD) layer 146, in accordance with some embodiments.

A contact etching stop layer 144 is formed over the semiconductor structure 100, as shown in FIGS. 2J-1 and 2J-2, in accordance with some embodiments. The contact etching stop layer 144 extends along and covers the surfaces of the source/drain features 142, the sidewalls of the gate spacer layers 128, the upper surfaces and sidewalls of the dielectric fin structure 114, and the upper surface of the isolation structure 112, in accordance with some embodiments. Afterward, an interlayer dielectric layer 146 is formed over the contact etching stop layer 144 and fills the space between the dummy gate structures 116, as shown in FIGS. 2J-1 and 2J-2, in accordance with some embodiments.

In some embodiments, the contact etching stop layer 144 is made of a dielectric material, such as silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 144 is globally and conformally deposited over the semiconductor structure 100 using CVD (such as LPCVD, PECVD, HDP-CVD, HARP, and FCVD), ALD, another suitable method, or a combination thereof.

In some embodiments, the interlayer dielectric layer 146 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 146 is made of a different material than the contact etching stop layer 144. In some embodiments, a dielectric material for the interlayer dielectric layer 146 is deposited using such as CVD (such as HDP-CVD, PECVD, HARP or FCVD), another suitable technique, and/or a combination thereof.

Afterward, the dielectric materials for the contact etching stop layer 144 and the interlayer dielectric layer 146 above the upper surfaces of the dummy gate electrode layer 120 are removed using such as CMP until the upper surfaces of the dummy gate structures 116 are exposed, in accordance with some embodiments. In some embodiments, the patterned hard mask layers 122 and 124 are also removed. In some embodiments, the upper surface of the interlayer dielectric layer 146 is substantially coplanar with the upper surfaces of the dummy gate electrode layers 120.

FIGS. 2K-1 and 2K-2 are cross-sectional views of a semiconductor structure 100 after the formation of a gate trench 148 and gaps 150, in accordance with some embodiments.

The dummy gate structures 116 are removed using one or more etching processes to form a gate trench 148, as shown in FIGS. 2K-1, in accordance with some embodiments. The gate trench 148 exposes the channel regions of the fin structure 104, in accordance with some embodiments. In some embodiments, the gate trench 148 also exposes the inner sidewalls of the gate spacer layer 126 facing the channel region, in accordance with some embodiments.

In some embodiments, the etching process includes one or more etching processes. For example, when the dummy gate electrode layer 120 is made of polysilicon, a wet etchant such as a tetramethylammonium hydroxide (TMAH) solution may be used to selectively remove the dummy gate electrode layer 120. For example, the dummy gate dielectric layer 118 may be thereafter removed using a plasma dry etching, a dry chemical etching, and/or a wet etching.

The first semiconductor layers 106 of the fin structure 104 are removed using an etching process to form gaps 150, as shown in FIG. 2K-1, in accordance with some embodiments. The inner spacer layers 134 may be used as an etching stop layer in the etching process, which may protect the source/drain features 142 from being damaged. The gaps 150 are located between the neighboring second semiconductor layers 108 and between the lowermost second semiconductor layer 108 and the lower fin element 104L of the fin structure 104, in accordance with some embodiments. In some embodiments, the gaps 150 also expose the inner sidewalls of the inner spacer layers 134 facing the channel region.

After the etching process, the four main surfaces (only upper and bottom surfaces are shown in FIG. 2K-1) of the second semiconductor layers 108 are exposed, in accordance with some embodiments. The exposed second semiconductor layers 108 form nanostructures that function as channel layers of the resulting semiconductor devices (e.g., a nanostructure transistor such as GAA FET), in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions. In some embodiments, the inner spacer layers 134 serve an etching stop layer in the etching process.

Figures 2, 2L:
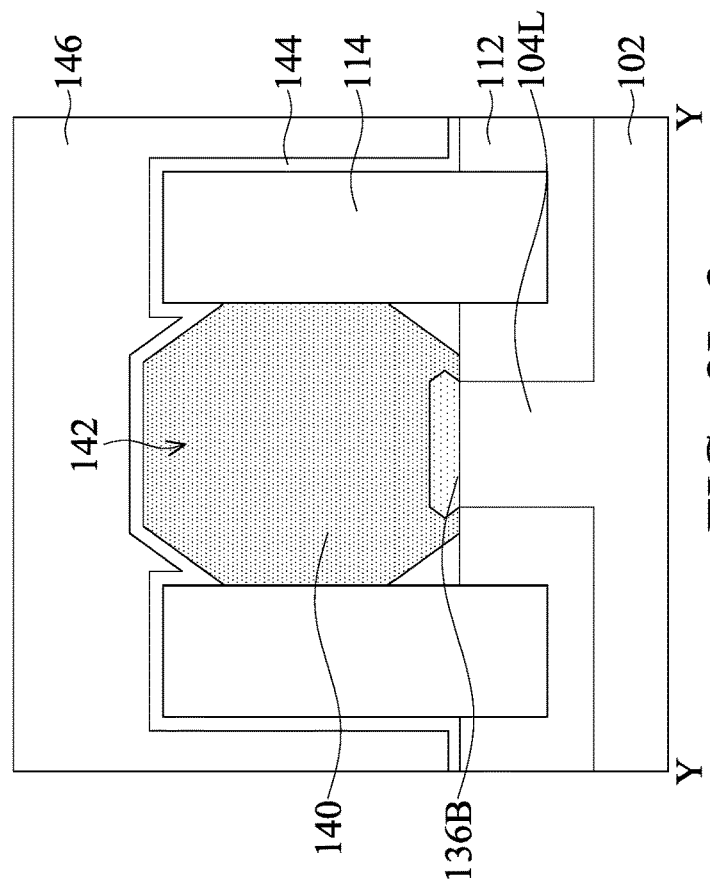
Figures 1, 2L:
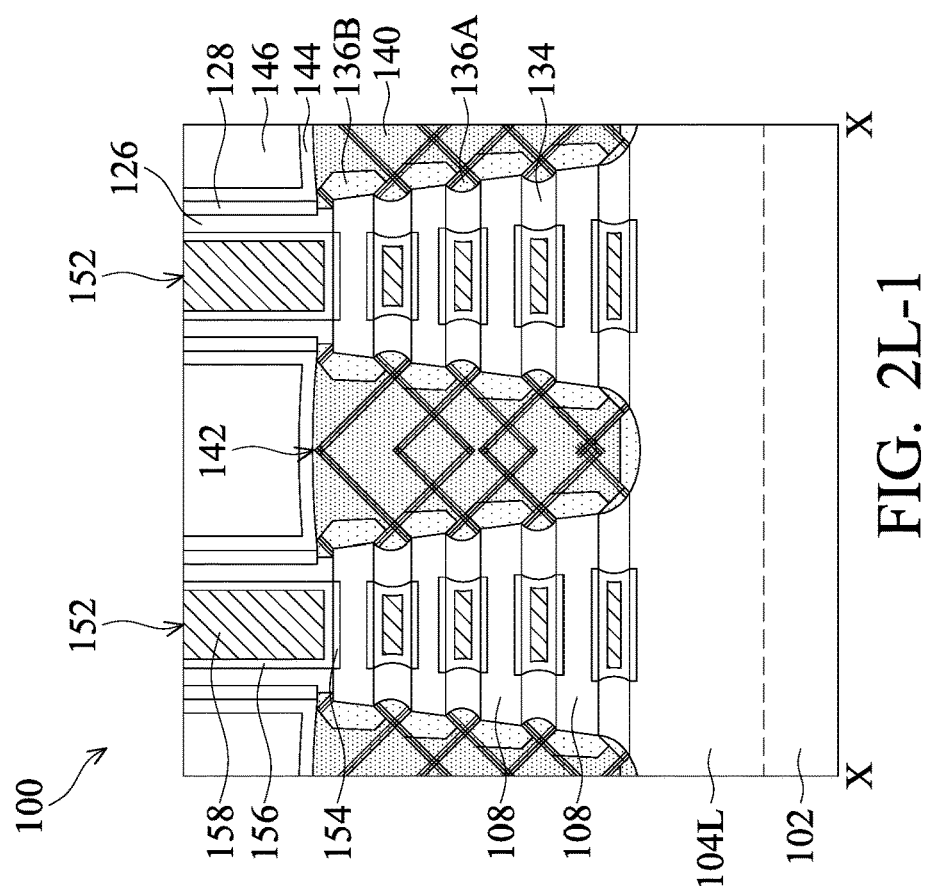

FIGS. 2L-1 and 2L-2 are cross-sectional views of a semiconductor structure 100 after the formation of final gate stacks 152, in accordance with some embodiments.

Interfacial layer 154 is formed on the exposed surfaces of the nanostructures 108 and the lower fin element 104L, as shown in FIG. 2L-1, in accordance with some embodiments. The interfacial layer 154 wraps around the nanostructures 108, in accordance with some embodiments.

In some embodiments, the interfacial layer 154 is made of a chemically formed silicon oxide. In some embodiments, the interfacial layers 154 are formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 104L is oxidized to form the interfacial layer 154, in accordance with some embodiments.

A gate dielectric layer 156 is formed conformally along the interfacial layer 154 to wrap around the nanostructures 108, as shown in FIG. 2L-1, in accordance with some embodiments. The gate dielectric layer 156 is also conformally formed along the inner sidewalls of the gate spacer layers 126 facing the channel region, in accordance with some embodiments. The gate dielectric layer 156 is also conformally formed along the inner sidewalls of the inner spacer layers 134 facing the channel region, in accordance with some embodiments.

The gate dielectric layer 156 may be high-k dielectric layer. In some embodiments, the high-k dielectric layer is made of a dielectric material with high dielectric constant (k value), for example, greater than 3.9. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), a combination thereof, or another suitable material. The high-k dielectric layer may be deposited using ALD, PVD, CVD, and/or another suitable technique.

A metal gate electrode layer 158 is formed over the gate dielectric layer 156 and fills remainders of the gate trench 148 and the gaps 150, as shown in FIG. 2L-1, in accordance with some embodiments. The metal gate electrode layer 158 wraps around the nanostructures 108, in accordance with some embodiments. In some embodiments, the metal gate electrode layer 158 is made of more than one conductive material, such as a metal, metal alloy, conductive metal oxide and/or metal nitride, another suitable conductive material, and/or a combination thereof. For example, the metal gate electrode layer 158 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 158 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 158 may be formed using ALD, PVD, CVD, e-beam evaporation, or another suitable process. The metal gate electrode layer 158 may be formed separately for re-channel nanostructure transistors and p-channel nanostructure transistors, which may use different work function materials.

A planarization process such as CMP may be performed on the semiconductor structure 100 to remove the materials of the gate dielectric layer 156 and the metal gate electrode layer 158 formed above the upper surface of the interlayer dielectric layer 146, in accordance with some embodiments. After the planarization process, the upper surface of the metal gate electrode layer 158 and the upper surface of the interlayer dielectric layer 146 are substantially coplanar, in accordance with some embodiments.

The interfacial layer 154, the gate dielectric layer 156 and the metal gate electrode layer 158 combine to form final gate stacks 152, in accordance with some embodiments. In some embodiments, the final gate stack 152 extends in Y direction. That is, the final gate stack 152 has longitudinal axes parallel to Y direction, in accordance with some embodiments. The final gate stack 152 wraps around each of the nanostructures 108 and is interposed between the source/drain features 142, in accordance with some embodiments.

The final gate stack 152 combines with the source/drain features 142 to form a nanostructure transistor, such as a n-channel nanostructure transistor or p-channel nanostructure transistor, in accordance with some embodiments. The final gate stack 152 may engage the channel region of the nanostructures 108, such that current can flow between the source/drain features 142 during operation.

It is understood that the semiconductor structure 100 may undergo further CMOS processes to form various features over the semiconductor structure 100, such as a multilayer interconnect structure (e.g., contacts to gate and/or source/drain features, vias, lines, inter metal dielectric layers, passivation layers, etc.).

Figure 3:
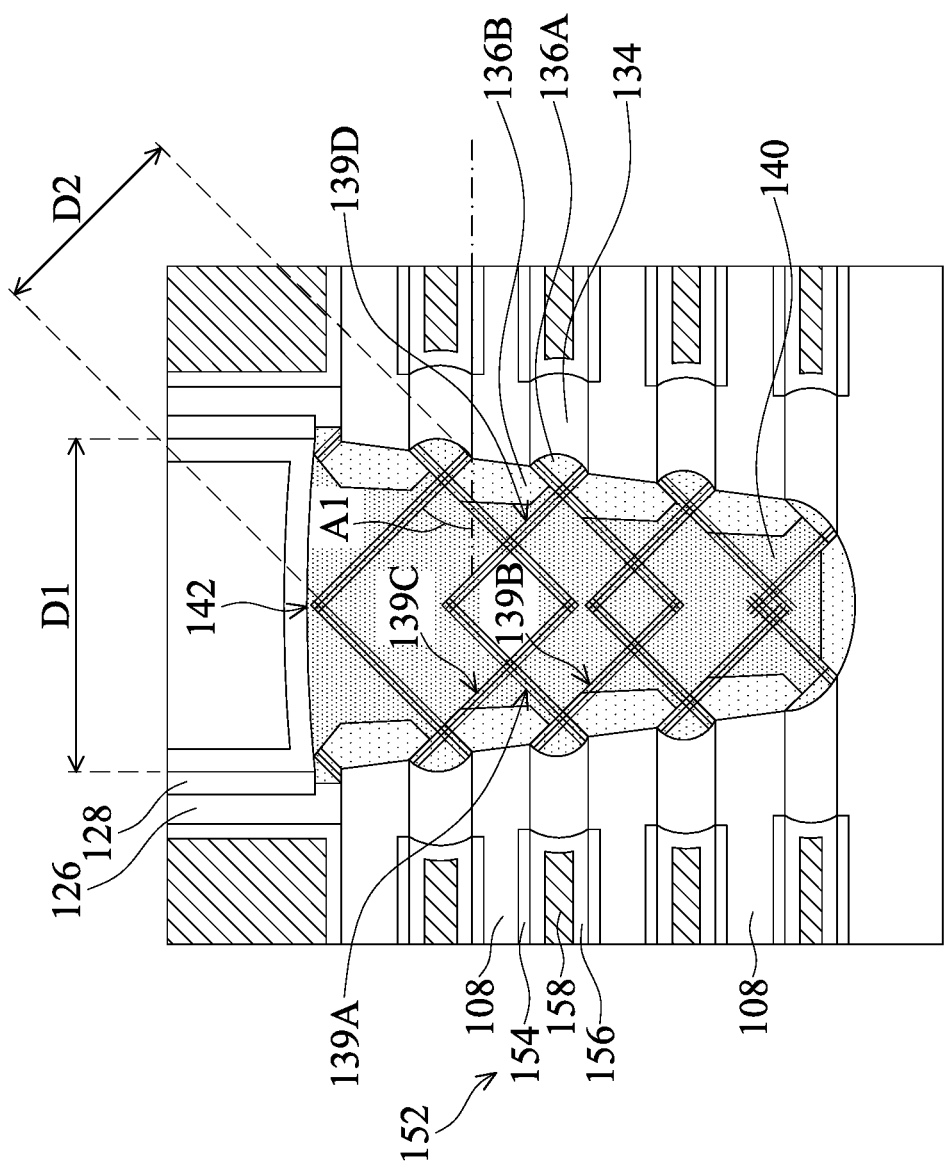
FIG. 3 is an enlarged view of FIG. 2L-1 to illustrate more detail of a source/drain feature and neighboring components, in accordance with some embodiments of the disclosure.

FIG. 3 is an enlarged view of FIG. 2L-1 to illustrate more detail of the source/drain feature 142 and the neighboring components, in accordance with some embodiments of the disclosure.

In some embodiments, a set of dislocations 139 is formed correspondingly at each interface between a barrier layer 136A and a barrier layer 136B, as shown in FIG. 3. That is, in some embodiments, one inner spacer layer 134 corresponds to two sets of dislocations 139 which extend in different directions. For example, a set 139A of dislocations 139 extends upwards and toward the center of the bulk layer 140 while a set 139B of dislocations 139 extends downward and toward the center of the bulk layer 140.

In some embodiments, the extending direction of a set of dislocations 139 is parallel to an extending direction of the interface between the barrier layer 136A and barrier layer 136B. In some embodiments, the extending direction of the set of dislocations 139 intersects the plane parallel to the upper surface of the substrate 102 at an acute angle A1. In some embodiments, the angle A1 is in a range from about 40 degrees to about 60 degrees.

Because the etching step of the epitaxial growth process (discussed in FIG. 5B) may control the barrier layer 136A to have a slower growth rate than the barrier layer 136B, the dislocations 139 are mainly formed from the sidewalls of the inner spacer layers 134 instead of from the sidewalls of the second semiconductor layers 108, in accordance with some embodiments. Therefore, it is possible to well control the dopant to diffuse into the barrier layers 136B and further pile up to the surface of the inner spacer layers 134.

In some embodiments, some sets of dislocations 139 may intersect. For example, a set 139A of dislocations 139 intersects with a set 139C of dislocations 139, and intersects with a set 139D of dislocations 139.

In some embodiments, the source/drain feature 142 has a width D1 measured along X direction. In some embodiments, the width D1 is in a range from about 15 nm to about 40 nm. In some embodiments, the dislocations 139 have a length D2 measured along their extending direction. In some embodiments, the length D2 is in a range from about 10 nm to about 20 nm. In some embodiments, a ratio (D2/D1) of the length D2 to the width D1 is in a range from about 0.4 to about 0.8. If the ratio (D2/D1) is too small, the increase in dopant concentration in the barrier layer 136A may not be sufficient. If the ratio (D2/D1) is too large, the strain applied to the nanostructures 108 may decrease.

As described above, the aspect of the present disclosure is directed to forming a semiconductor structure having a reduced junction overlap. Embodiments of the semiconductor structure include a source/drain feature 142 having dislocations 139 therein, and the dislocations 139 start from the sidewalls of the inner spacer 134 and propagate into the bulk layer 140 of the source/drain feature 142. The dopant can diffuse, along the dislocations 139, from the bulk layer 140 into the barrier layer 136A and further piles to the inner spacer 134. Therefore, a reduction of the junction overlap may be achieved and the performance of the resulting semiconductor device may be enhanced without further scaling down the semiconductor devices. In addition, the concentration of the dopant in barrier layers 136B keeps substantially the same. Therefore, the performance of the semiconductor device may not be negatively affected.

Embodiments of a semiconductor structure may be provided. The semiconductor structure may include a source/drain feature, and the source/drain feature may include first barrier layers on inner spacer layers and second barrier layers on nanostructures. The dopant has a first average concentration in the first barrier layers and a second average concentration in the second barrier layers, and the first average concentration is higher than the second average concentration. Therefore, a reduction of the junction overlap may be achieved and the performance of the semiconductor device may be enhanced without further scaling down the semiconductor devices. In addition, the concentration of the dopant in barrier layers 136B keeps substantially the same. Therefore, the performance of the semiconductor device may not be negatively affected.

In some embodiments, a semiconductor structure is provided. The semiconductor structure includes a first nanostructure stacked over and spaced apart from a second nanostructure, a gate stack wrapping around the first nanostructure and the second nanostructure, a source/drain feature adjoining the first nanostructure and the second nanostructure, and a first inner spacer layer interposing the gate stack and the source/drain feature and interposing the first nanostructure and the second nanostructure. A dopant in the source/drain feature has a first concentration at an interface between the first inner spacer layer and the source/drain feature and a second concentration at a first distance away from the interface, and the first concentration is higher than the second concentration.

In some embodiments, a semiconductor structure is provided. The semiconductor structure includes a plurality of first nanostructures over a substrate, a gate stack wrapping around the first nanostructures, a plurality of first inner spacer layers interposing the first nanostructures and adjoining the gate stack, and a source/drain feature in contact with the first nanostructures and the first inner spacer layers. The source/drain feature is doped with a dopant, and the source/drain feature includes first barrier layers on the first inner spacer layers, and second barrier layers on the first nanostructures. The dopant has a first average concentration in the first barrier layers and a second average concentration in the second barrier layers, and the first average concentration is higher than the second average concentration.

In some embodiments, a method for forming semiconductor structure is provided. The method includes forming a fin structure over a substrate, wherein the fin structure includes first semiconductor layers and second semiconductor layers alternatingly stacked, etching the fin structure to form a source/drain recess, recessing the first semiconductor layers from the source/drain recess to form notches, forming inner spacer layers in the notches, growing first barrier layers and second barrier layers of a source/drain feature on the inner spacer layers and the first semiconductor layers, respectively, growing a bulk layer of the source/drain feature on the first barrier layers and the second barrier layers to fill the source/drain recess, and annealing the source/drain feature. After the annealing, the dopant of the source/drain feature has a first average concentration in the first barrier layers and a second average concentration in the second barrier layers, and the first average concentration is higher than the second average concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a fin structure over a substrate, wherein the fin structure comprises first semiconductor layers and second semiconductor layers alternatingly stacked;
    etching the fin structure to form a source/drain recess;
    recessing the first semiconductor layers from the source/drain recess to form notches;
    forming inner spacer layers in the notches;
    growing first barrier layers and second barrier layers of a source/drain feature on the inner spacer layers and the second semiconductor layers, respectively;
    growing a bulk layer of the source/drain feature on the first barrier layers and the second barrier layers to fill the source/drain recess; and
    annealing the source/drain feature, wherein after the annealing, a dopant of the source/drain feature has a first average concentration in the first barrier layers and a second average concentration in the second barrier layers, and the first average concentration is higher than the second average concentration.

2. The method for forming the semiconductor structure as claimed in claim 1, wherein before the annealing, the dopant of the source/drain feature has a third average concentration in the first barrier layers and a fourth average concentration in the second barrier layers, and the third average concentration is substantially the same as the fourth average concentration.

3. The method for forming the semiconductor structure as claimed in claim 1, wherein growing the first barrier layers and the second barrier layers of the source/drain feature comprises multiple cycles of a deposition step followed by an etching step.

4. The method for forming the semiconductor structure as claimed in claim 3, wherein an etching amount of the first barrier layers is greater than an etching amount of the second barrier layers in the etching step.

5. The method for forming the semiconductor structure as claimed in claim 1, wherein a set of dislocations extends from a sidewall of at least one of the inner spacer layers and into the bulk layer, and during the annealing, the dopant diffuses along the dislocations and piles up to the sidewall of the one of the inner spacer layers.

6. A method for forming the semiconductor structure, comprising:
    forming a semiconductor fin structure in which first semiconductor layers and second semiconductor layers are alternatingly stacked over a fin element;

forming inner spacer layers on sidewalls of the first semiconductor layers;

forming first barrier layers and second barrier layers of a source/drain feature on the inner spacer layers and the second semiconductor layers, respectively, wherein forming the first barrier layers and the second barrier layers comprises repeating steps of:

depositing first layers and second layers on the inner spacer layers and the second semiconductor layers, respectively; and etching the first layers at a first etching rate and the second layers at a second etching rate, wherein the first etching rate is greater than the second etching rate; and forming a bulk layer of the source/drain feature on the first barrier layers and the second barrier layers.

7. The method for forming the semiconductor structure as claimed in claim 6, further comprising:

annealing the source/drain feature so that dopants diffuse from the bulk layer into the first barrier layers and pile up to sidewalls of the inner spacer layers.

8. The method for forming the semiconductor structure as claimed in claim 7, wherein after the annealing, a first dopant concentration of the first barrier layers is higher than the second dopant concentration of the second barrier layers.

9. The method for forming the semiconductor structure as claimed in claim 6, wherein:

before etching the first layers, the first layers have a first thickness, after etching the first layers, the first layers have a second thickness, and a ratio of the second thickness to the first thickness is in a range from about 0.2 to about 0.7.

10. The method for forming the semiconductor structure as claimed in claim 6, wherein:

before etching the second layers, the second layers have a first thickness, after etching the second layers, the second layers have a second thickness, and a ratio of the second thickness to the first thickness is greater than about 0.9.

11. The method for forming the semiconductor structure as claimed in claim 6, wherein the first barrier layers are interfaced with the second barrier layers, and sets of dislocations are formed on respective interfaces between the first barrier layers and the second barrier layers.

12. The method for forming the semiconductor structure as claimed in claim 11, wherein the sets of dislocations extend into the bulk layer of the source/drain feature.

13. The method for forming the semiconductor structure as claimed in claim 12, wherein one of the sets of dislocations intersects with another one of the sets of dislocations.

14. The method for forming the semiconductor structure as claimed in claim 6, further comprising:

removing the first semiconductor layer to form gaps; and forming a gate stack to fill the gaps.

15. The method for forming the semiconductor structure as claimed in claim 6, further comprising:

forming an isolation structure to surround the fin elements; and forming dielectric fin structures on the isolation structure, wherein the semiconductor fin structure is located between the dielectric fin structures, and the bulk layer is in direct contact with the dielectric fin structures.

16. A method for forming the semiconductor structure, comprising:

alternatingly stacking first semiconductor layers and second semiconductor layers over a substrate;

patterning the first semiconductor layers and second semiconductor layers into a fin structure;

forming a dummy gate structure over the fin structure;

etching the fin structure to form a recess;

forming a source/drain feature in the recess, wherein the source/drain feature is doped with a dopant, the source/drain feature includes barrier layers and a bulk layer on the barrier layers, the dopant in the barrier layers has a first average concentration, the dopant in the bulk layer has a second average concentration that is higher than the first average concentration, and the source/drain feature further includes dislocations extending from the barrier layers into the bulk layer; and annealing the source/drain feature such that a dopant diffuses from the bulk layer to the barrier layers along the dislocations; and removing the dummy gate structure.

17. The method for forming the semiconductor structure as claimed in claim 16, further comprising:

laterally recessing the first semiconductor layers of the fin structure to form notches; and forming inner spacer layers in the notches.

18. The method for forming the semiconductor structure as claimed in claim 17, wherein the barrier layers are divided into a first group and a second group, the barrier layers in the first group are formed on the respective inner spacer layers, and the barrier layers in the second group are formed on the respective second semiconductor layers.

19. The method for forming the semiconductor structure as claimed in claim 18, wherein the first group of the barrier layers includes a first barrier layer, and the dopant in the first barrier layer has:

a first concentration at an interface between the first barrier layer and the corresponding inner spacer layer, a second concentration at an interior of the first barrier layer, and the first concentration is higher than the second concentration.

20. The method for forming the semiconductor structure as claimed in claim 19, wherein the second group of the barrier layers includes a second barrier layer interfaced with the first barrier layer, and the dislocations extend from an interface between the first barrier layer and the second barrier layer.

* * * * *